United States Patent
Kai et al.

(10) Patent No.: US 12,154,942 B1
(45) Date of Patent: *Nov. 26, 2024

(54) MANUFACTURING METHOD FOR A POWER MOSFET WITH GATE-SOURCE ESD DIODE STRUCTURE

(71) Applicant: Diodes Incorporated, Plano, TX (US)

(72) Inventors: Wan-Yu Kai, New Taipei (TW); Chia-Wei Hu, New Taipei (TW); Ta-Chuan Kuo, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/747,337

(22) Filed: Jun. 18, 2024

Related U.S. Application Data

(62) Division of application No. 18/416,776, filed on Jan. 18, 2024.

(51) Int. Cl.
| | |
|---|---|
| *H01L 29/06* | (2006.01) |
| *H01L 27/02* | (2006.01) |
| *H01L 29/423* | (2006.01) |
| *H01L 29/78* | (2006.01) |

(52) U.S. Cl.
CPC ........ *H01L 29/063* (2013.01); *H01L 27/0255* (2013.01); *H01L 29/4236* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 5,940,258 A * | 8/1999 | Duvvury | H01L 27/0266 257/355 |
| 6,413,822 B2 | 7/2002 | Williams et al. | |
| 2002/0088991 A1 * | 7/2002 | Hisamoto | H01L 29/7808 257/106 |
| 2008/0042208 A1 * | 2/2008 | Hshieh | H01L 29/66727 257/E21.409 |
| 2009/0101974 A1 | 4/2009 | Saito et al. | |
| 2010/0224931 A1 * | 9/2010 | Hsieh | H01L 29/7808 257/E27.016 |
| 2011/0266593 A1 * | 11/2011 | Hsieh | H01L 29/7803 257/E29.262 |
| 2012/0205666 A1 | 8/2012 | Henning et al. | |
| 2015/0340356 A1 * | 11/2015 | Naito | H01L 27/0255 257/499 |
| 2016/0027771 A1 | 1/2016 | Su et al. | |
| 2018/0061823 A1 * | 3/2018 | Weyers | H01L 29/1095 |

(Continued)

*Primary Examiner* — Nicholas J Tobergte
(74) *Attorney, Agent, or Firm* — AP3 Law Firm PLLC

(57) ABSTRACT

A method includes growing an epitaxial layer over a substrate, forming a plurality of gates in the epitaxial layer, forming a breakdown voltage enhancement and leakage prevention structure in the epitaxial layer, comprising a body ring structure, forming a source in the epitaxial layer and a gate-source Electrostatic Discharge (ESD) diode structure over the epitaxial layer, forming a source contact connected to the source and a first terminal of the gate-source ESD diode structure, forming a gate contact connected to the plurality of gates and a second terminal of the gate-source ESD diode structure, and forming a drain contact on the opposing side of the epitaxial layer from the source contact.

20 Claims, 24 Drawing Sheets

(56) References Cited

U.S. PATENT DOCUMENTS

2018/0151366 A1    5/2018  Endo et al.
2018/0301537 A1   10/2018  Weyers et al.
2022/0045184 A1    2/2022  Hsieh
2022/0320268 A1 * 10/2022  Moriya .............. H01L 29/0878

* cited by examiner

MANUFACTURING METHOD FOR A POWER MOSFET WITH GATE-SOURCE ESD DIODE STRUCTURE

CROSS-REFERENCE TO RELATED APPLICATIONS

This patent application claims priority to, and specifically, is a divisional of, U.S. application Ser. No. 18/416,776, filed on Jan. 18, 2024, and entitled "Power MOSFET with Gate-Source ESD Diode Structure," which is hereby incorporated by reference herein as if reproduced in its entirety.

TECHNICAL FIELD

Embodiments of the invention relate to a power Metal-Oxide-Semiconductor Field-Effect Transistor (MOSFET), and, in particular embodiments, to a power MOSFET with a gate-source Electrostatic Discharge (ESD) diode structure and a breakdown voltage enhancement and leakage prevention structure.

BACKGROUND

As semiconductor technologies evolve, power MOSFETs have been widely used in various industry applications. Power MOSFETs are voltage controlled devices. When a control voltage is applied to the gate a power MOSFET and the control voltage is greater than the threshold of the power MOSFET, a conductive channel is established between the drain and the source of the power MOSFET. As a result, a current flows between the drain and the source of the power MOSFET. On the other hand, when the control voltage is less than the threshold of the power MOSFET, the power MOSFET is turned off accordingly.

Power MOSFETs may include two major categories. One is n-channel power MOSFETs. The other is p-channel power MOSFETs. According to the structure difference, power MOSFETs can be further divided into three sub-categories, planar power MOSFETs, lateral power MOSFETs and vertical power MOSFETs.

Vertical power MOSFETs have been widely used in high voltage and high current applications due to their low gate drive power, fast switching speed and lower on resistance. In a vertical power MOSFET, the drain and source are placed on opposite sides of a wafer. There may be a trench structure formed between the drain and the source of the vertical power MOSFET.

The input/output terminals of the vertical power MOSFET must be protected from electrostatic discharge (ESD) voltages. For example, the gate of a vertical power MOSFET is a crucial element. Excessive voltage at the gate relative to the source can lead to breakdown and damage. To protect the gate of the vertical power MOSFET from ESD, a back-to-back ESD diode structure may be connected between the gate and source terminals of the vertical power MOSFET. The back-to-back ESD diode structure may be implemented as an array of doped p and n+ regions arranged in an alternating manner. For example, the array may comprise a first p-type region, a first n+ region, a second p-type region, a second n+ region and a third p-type region connected in cascade. Alternatively, the array may comprise a first n+ region, a first p-type region, a second n+ region, a second p-type region and a third n+ region connected in cascade. The p-n+ structure is a common configuration for ESD protection diodes. The p-n+ structure helps create a structure having a low breakdown voltage, making the ESD diode structure suitable for clamping and diverting the excess voltage during an ESD event, thereby protecting the gate of the vertical power MOSFET from being damaged.

SUMMARY

These and other problems are generally solved or circumvented, and technical advantages are generally achieved, by preferred embodiments of the present disclosure which provide a power MOSFET with a gate-source ESD diode structure and a breakdown voltage enhancement and leakage prevention structure.

In accordance with an embodiment, an apparatus comprises a drain and a source on opposing sides of an epitaxial layer, a plurality of gates formed in the epitaxial layer, a source contact connected to the source, a gate contact connected to the plurality of gates, a gate-source electrostatic discharge (ESD) diode connected between the gate contact and the source contact, and a breakdown voltage enhancement and leakage prevention structure formed underneath the gate-source ESD diode structure.

In accordance with another embodiment, a method comprises growing an epitaxial layer over a substrate, forming a plurality of gates in the epitaxial layer, forming a body region and a breakdown voltage enhancement and leakage prevention structure in the epitaxial layer, forming a source in the epitaxial layer and a gate-source ESD diode structure over the epitaxial layer, and forming a source contact connected to the source and a first terminal of the gate-source ESD diode structure, and a gate contact connected to the plurality of gates and a second terminal of the gate-source ESD diode structure.

In accordance with yet another embodiment, a power MOSFET comprises an epitaxial layer over a substrate, a plurality of gates formed in the epitaxial layer, a body region formed in the epitaxial layer, a source formed in the body region, a gate-source ESD diode structure formed over the epitaxial layer, a body ring structure formed in the epitaxial layer and underneath the gate-source ESD diode structure, an interlayer dielectric layer formed over the epitaxial layer, wherein the gate-source ESD diode structure is in the interlayer dielectric layer, a plurality of source contact plugs, wherein at least one of the plurality of source contact plugs extends through the interlayer dielectric layer, the source and partially through the body region, a gate contact plug extending partially through the interlayer dielectric layer, a gate contact connected to the plurality of gates and a first terminal of the gate-source ESD diode structure through the gate contact plug, and a source contact connected to the source, the body region and a second terminal of the gate-source ESD diode structure through the plurality of source contact plugs.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a power MOSFET with a gate-source ESD diode structure and a breakdown voltage enhancement and leakage prevention structure. The disclosure may also be applied, however, to a variety of power transistors. Hereinafter, various embodiments will be explained in detail with reference to the accompanying drawings.

Figure 1:
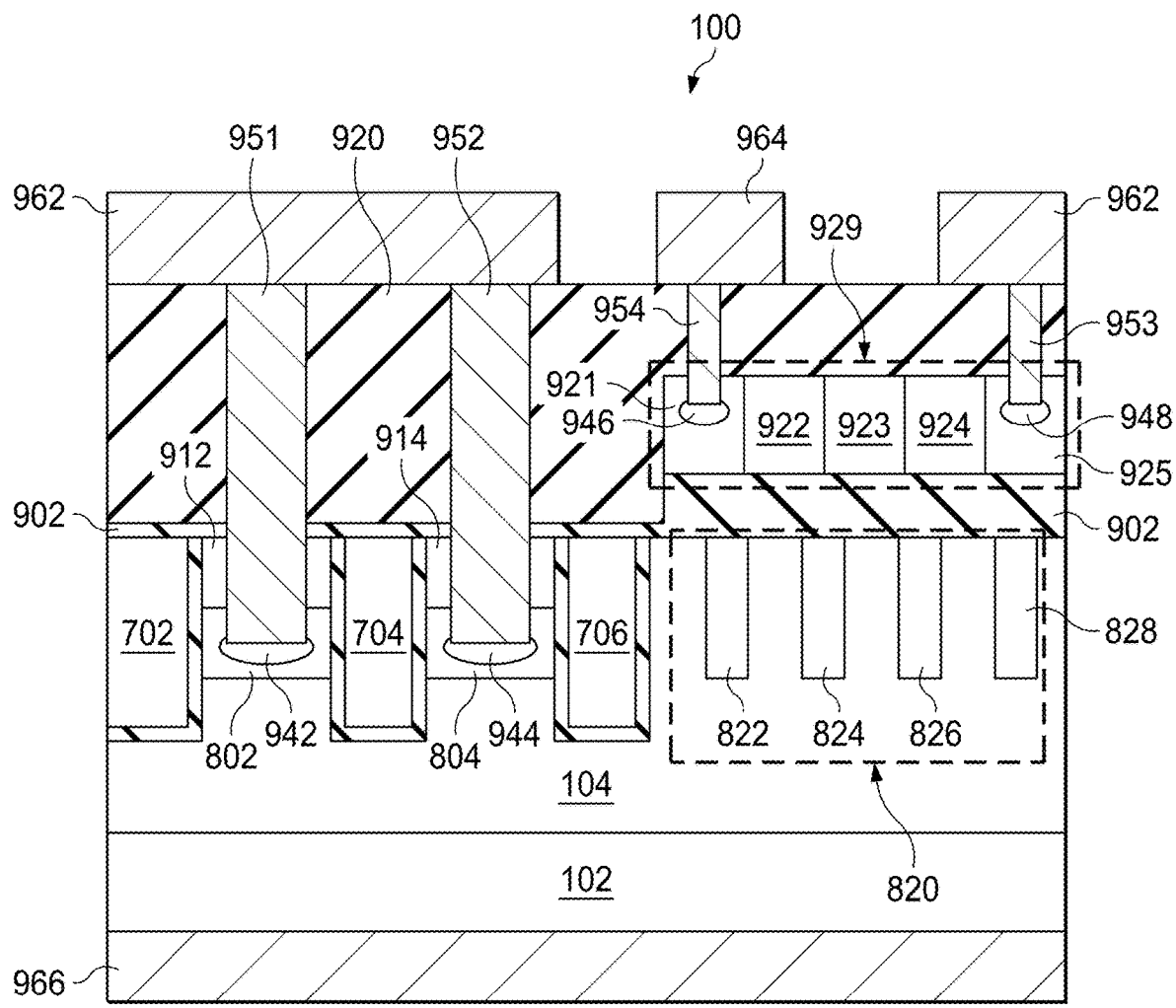
FIG. 1 illustrates a cross sectional view of a power MOSFET having a gate-source ESD diode structure and a breakdown voltage enhancement and leakage prevention structure in accordance with various embodiments of the present disclosure.

FIG. 1 illustrates a cross sectional view of a power MOSFET having a gate-source ESD diode structure and a breakdown voltage enhancement and leakage prevention structure in accordance with various embodiments of the present disclosure. The power MOSFET 100 comprises a substrate 102, an epitaxial layer 104, a plurality of gates 702, 704 and 706, a body comprising a first body region 802 and a second body region 804, a source comprising a first source region 912 and a second source region 914, a body ring structure 820, an interlayer dielectric layer 920, a plurality of source contact plugs 951, 952 and 953, a gate contact plug 954, a gate-source ESD diode structure 929, a source contact 962, a gate contact 964 and a drain contact 966.

As shown in FIG. 1, the epitaxial layer 104 is formed over the substrate 102. The plurality of gates 702, 704 and 706 is formed in the epitaxial layer 104. The first body region 802 is formed in the epitaxial layer 104 and between the gates 702 and 704. The second body region 804 is formed in the epitaxial layer 104 and between the gates 704 and 706. It should be noted that although the body regions 802 and 804 may be two separate regions from the cross sectional view shown in FIG. 1, the body regions 802 and 804 can also be portions of a continuous body region from a top view.

As shown in FIG. 1, the first source region 912 is formed in the first body region 802 and between the gates 702 and 704. The second source region 914 is formed in the second body region 804 and between the gates 704 and 706. It should be noted that although the source regions 912 and 914 may be two separate regions from the cross sectional view shown in FIG. 1, the source regions 912 and 914 can also be portions of a continuous source region from a top view.

The interlayer dielectric layer 920 is formed over the epitaxial layer 104. The gate-source ESD diode structure 929 is formed over the epitaxial layer and in the interlayer dielectric layer 920. The gate-source ESD diode structure 929 comprises a plurality of n+ regions and a plurality of p-type regions arranged in an alternating manner. In some embodiments, the gate-source ESD diode structure 929 comprises a first p-type region 921, a first n+ region 922, a second p-type region 923, a second n+ region 924 and a third p-type region 925 connected in cascade. The first p-type region 921 is connected to the gate contact 964. The third p-type region 925 is connected to the source contact 962.

The body ring structure 820 is formed in the epitaxial layer 104 and underneath the gate-source ESD diode structure 929. From the cross sectional view shown in FIG. 1, the body ring structure 820 comprises four columns 822, 824, 826 and 828. In some embodiments, from a top view, the body ring structure 820 is a concentric ring structure formed in the epitaxial layer 104.

The body ring structure 820 functions as a breakdown voltage enhancement and leakage prevention structure. In operation, the body ring structure 820 is configured to disperse an electric field on the gate-source ESD diode structure 929. The body ring structure 820 provides an electric field gradient that reduces the peak electric field at the edge of the gate-source ESD diode structure 929, thereby spreading the electric field more evenly. As a result, the breakdown voltage of the power MOSFET 100 can be improved, and the leakage of the power MOSFET 100 can be reduced.

As shown in FIG. 1, the source contact plug 951 extends through the interlayer dielectric layer 920, the first source region 912 and partially through the first body region 802. A first terminal of the source contact plug 951 is connected to the source contact 962. A second terminal of the source contact plug 951 is connected to a first p+ region 942 formed in the first body region 802.

The source contact plug 952 extends through the interlayer dielectric layer 920, the second source region 914 and partially through the second body region 804. A first terminal of the source contact plug 952 is connected to the source contact 962. A second terminal of the source contact plug 952 is connected to a second p+ region 944 formed in the second body region 804.

The source contact plug 953 extends partially through the interlayer dielectric layer 920, and partially through the third p-type region 925. A first terminal of the source contact plug 953 is connected to the source contact 962. A second terminal of the source contact plug 953 is connected to a fourth p+ region 948 formed in the third p-type region 925.

The gate contact plug 954 extends partially through the interlayer dielectric layer 920, and partially through the first p-type region 921. A first terminal of the gate contact plug 954 is connected to the gate contact 964. A second terminal of the gate contact plug 954 is connected to a third p+ region 946 formed in the first p-type region 921.

In some embodiments, the power MOSFET shown in FIG. 1 can be implemented as an n-type power MOSFET. The substrate 102 is an n+ substrate. The epitaxial layer 104 is an n-type layer. The doping concentration of the epitaxial layer 104 is lower than that of the substrate 102. The body region is a p-type region. The source is an n+ region. The body ring structure 820 is a p-type body ring structure. The n-type regions (e.g., source regions 912 and 914) in FIG. 1 are formed by implanting n-type dopants such as phosphorous, arsenic or the like. Alternatively, the n-type regions can be formed by a diffusion process. The p-type regions (e.g., body regions 802 and 804) in FIG. 1 are formed by implanting p-type doping materials such as boron, gallium, aluminum, indium, combinations thereof, or the like. Alternatively, the p-type regions can be formed by a diffusion process.

In alternative embodiments, the power MOSFET shown in FIG. 1 can be implemented as a p-type power MOSFET. The substrate 102 is a p+ substrate. The epitaxial layer 104 is a p-type layer. The doping concentration of the epitaxial layer 104 is lower than that of the substrate 102. The body region is an n-type region. The source is a p+ region. The body ring structure 820 is an n-type body ring structure.

As shown in FIG. 1, the drain contact 966 is formed underneath the substrate 102. In other words, the source contact 962 and the drain contact 964 of the power MOSFET 100 are fabricated on opposite sides of a wafer.

FIGS. 2-16 illustrate cross section views of intermediate steps of fabricating the power MOSFET shown in FIG. 1 in accordance with various embodiments of the present disclosure.

Figure 2:
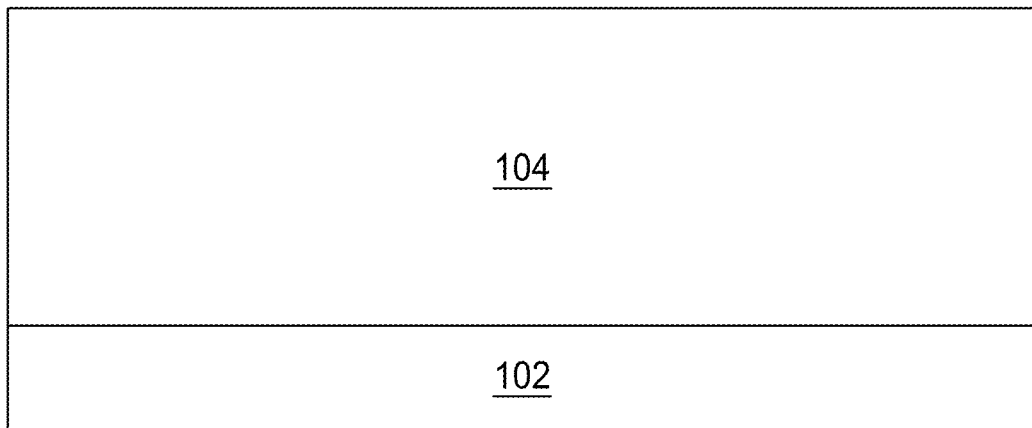
FIG. 2 illustrates a cross sectional view of a semiconductor device after an epitaxial layer is grown from a substrate in accordance with various embodiments of the present disclosure.

FIG. 2 illustrates a cross sectional view of a semiconductor device after an epitaxial layer is grown from a substrate in accordance with various embodiments of the present disclosure. In accordance with an embodiment, the substrate 102 may be an n+ substrate, which is doped with an n-type impurity such as phosphorous, arsenic or the like.

An n-type epitaxial layer 104 is grown from the substrate 102. The epitaxial growth of the n-type epitaxial layer 104 may be implemented by using suitable semiconductor fabrication processes such as chemical vapor deposition (CVD), ultra-high vacuum chemical vapor deposition (UHV-CVD) and the like.

Figure 3:
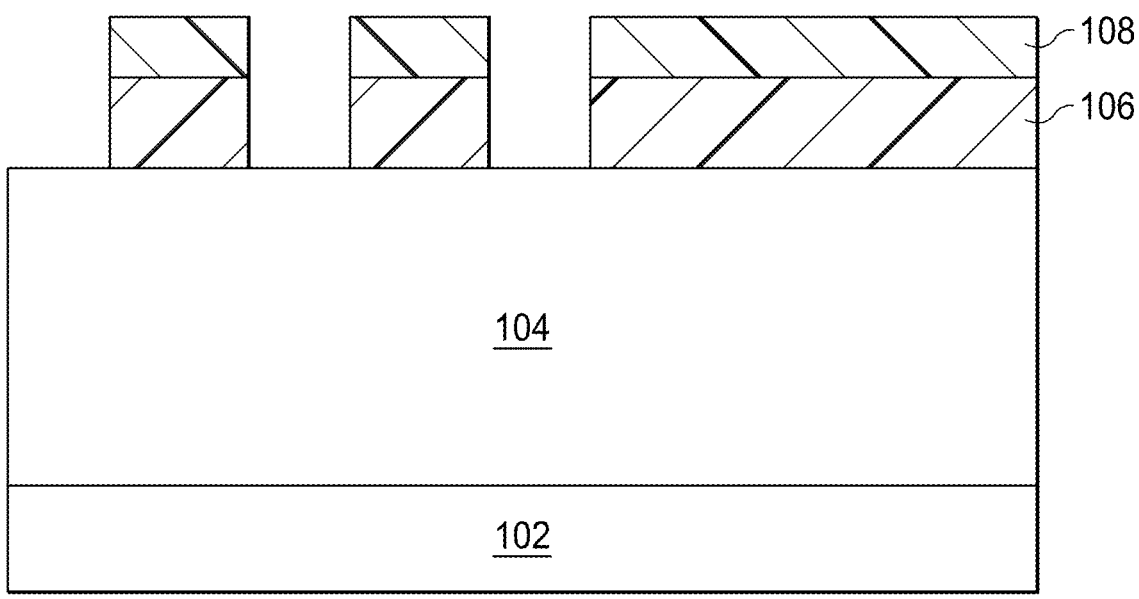
FIG. 3 illustrates a cross sectional view of the semiconductor device shown in FIG. 2 after an etching process is performed on a hard mask layer to define the pattern of the hard mask layer in accordance with various embodiments of the present disclosure.

FIG. 3 illustrates a cross sectional view of the semiconductor device shown in FIG. 2 after an etching process is performed on a hard mask layer to define the pattern of the hard mask layer in accordance with various embodiments of the present disclosure. In accordance with an embodiment, a hard mask layer 106 is deposited on top of the epitaxial layer 104 using suitable fabrication techniques such as CVD and the like. The hard mask layer 106 may be formed of suitable materials such as silicon nitride. The hard mask layer 106 functions as an etching mask.

A photoresist layer 108 is formed over the hard mask layer 106 using a spin on deposition and the like. The photoresist layer 108 is patterned using suitable photolithography techniques. Thereafter, the hard mask layer 106 is patterned in consideration with the location of the plurality of gates 702, 704 and 706 of the power MOSFET 100 shown in FIG. 1.

Figure 4:
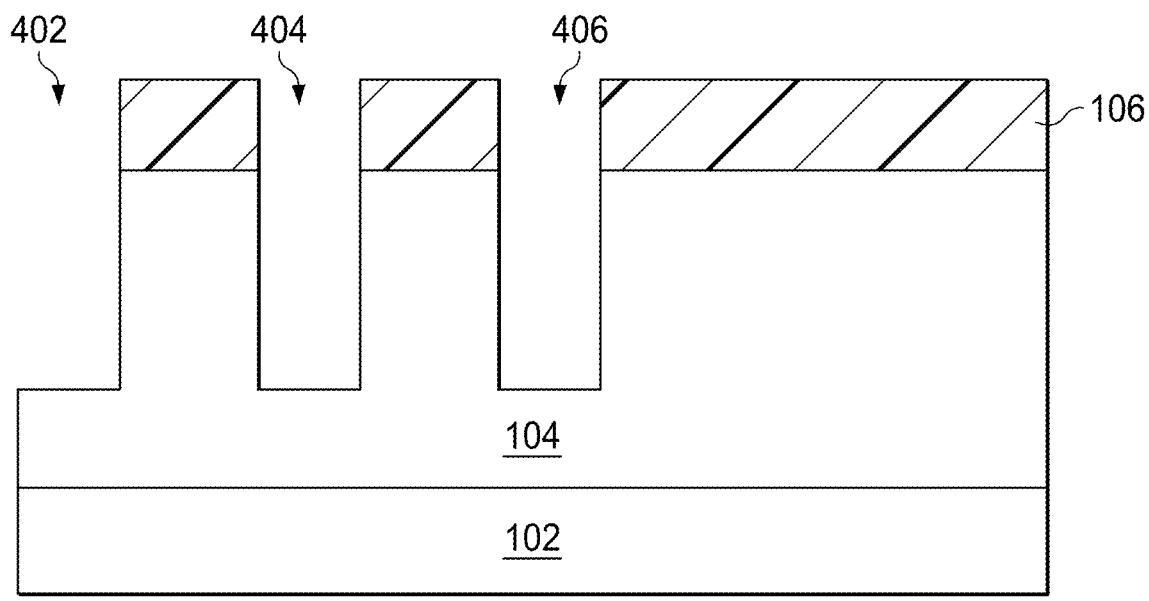
FIG. 4 illustrates a cross sectional view of the semiconductor device shown in FIG. 3 after three trenches are formed in the epitaxial layer in accordance with various embodiments of the present disclosure.

FIG. 4 illustrates a cross sectional view of the semiconductor device shown in FIG. 3 after three trenches are formed in the epitaxial layer in accordance with various embodiments of the present disclosure. The remaining photoresist layer 108 shown in FIG. 3 may be removed by using suitable photoresist stripping techniques such as chemical solvent cleaning, plasma ashing, dry stripping and the like. The photoresist stripping techniques are well known, and hence are not discussed in further detail herein to avoid repetition. Thereafter, an etching process, such as a reactive ion etch (RIE) or other dry etch, an anisotropic wet etch, or any other suitable anisotropic etch or patterning process, is performed to form three trenches in the epitaxial layer 104, namely a first trench 402, a second trench 404 and a third trench 406 as shown in FIG. 4.

Figure 5:
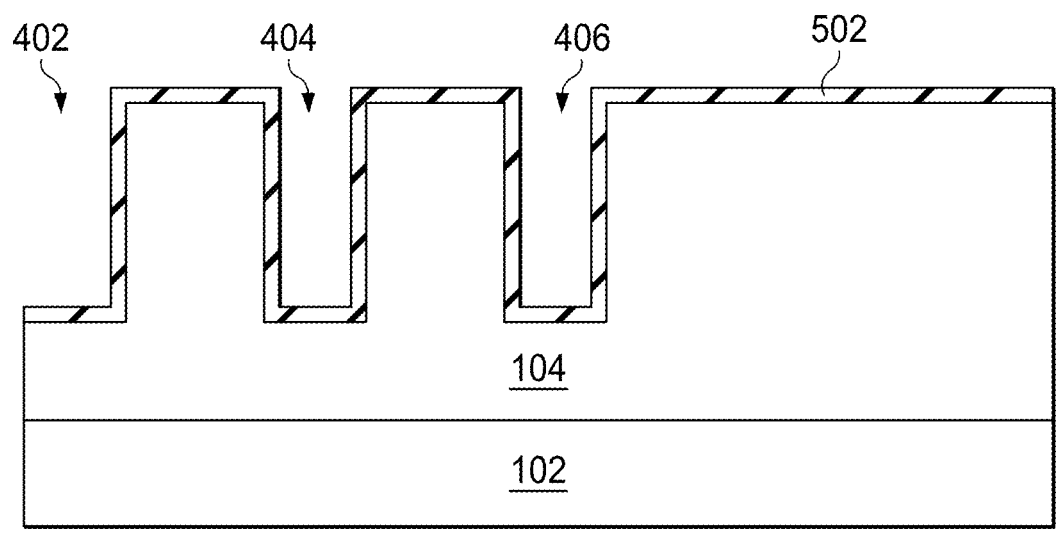
FIG. 5 illustrates a cross sectional view of the semiconductor device shown in FIG. 4 after a thin dielectric layer is formed in the trenches and over the epitaxial layer in accordance with various embodiments of the present disclosure.

FIG. 5 illustrates a cross sectional view of the semiconductor device shown in FIG. 4 after a thin dielectric layer is formed in the trenches and over the epitaxial layer in accordance with various embodiments of the present disclosure. As shown in FIG. 5, the hard mask layer 106 shown in FIG. 4 has been removed through a suitable hard mask layer removal process such as a wet etch process. The removal process is applied to the top surface of the semiconductor device until the epitaxial layer 104 is exposed.

The thin dielectric layer 502 is a gate dielectric layer. As shown in FIG. 5, the thin dielectric layer 502 is formed on the bottoms of the trenches 402, 404 and 406 as well as the sidewalls of the trenches. The thin dielectric layer 502 may be formed of commonly used dielectric materials such as oxides, nitrides, oxynitrides, high-k materials, combinations thereof, and multi-layers thereof.

In accordance with an embodiment, the thin dielectric layer 502 is an oxide layer. The thin dielectric layer 502 may be formed by using suitable thermal treatment techniques, wet treatment techniques or deposition techniques such as Physical Vapor Deposition (PVD), CVD, Atomic Layer Deposition (ALD) and the like.

Figure 6:
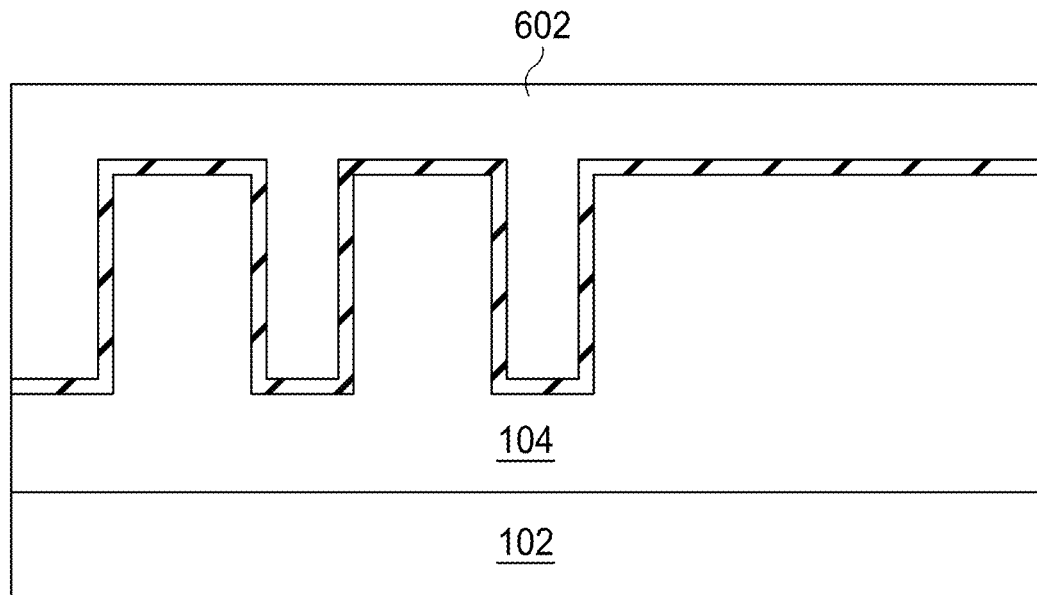
FIG. 6 illustrates a cross sectional view of the semiconductor device shown in FIG. 5 after a gate electrode material is filled in the trenches in accordance with various embodiments of the present disclosure.

FIG. 6 illustrates a cross sectional view of the semiconductor device shown in FIG. 5 after a gate electrode material is filled in the trenches in accordance with various embodiments of the present disclosure. The gate electrode material is filled in the trenches 402, 404 and 406. The gate electrode material also forms a gate electrode layer 602 over the epitaxial layer 104.

In some embodiments, the gate electrode material is polysilicon. In accordance with an embodiment, the polysilicon layer is doped with n-type impurity ions to become a gate conductive layer. While phosphorous is used as the n-type impurity ions, other n-type conductive ions may be used if necessary or desired. Doping of the n-type impurity ions in the polysilicon layer preferably is implemented through a separate n-type impurity ion doping process after deposition of the polysilicon layer, or by depositing the polysilicon layer while doping the n-type impurity ions.

An annealing process is applied to the polysilicon layer. The annealing process is employed to diffuse the n-type impurity ions into the polysilicon layer. The annealing process may be implemented as a rapid thermal process.

Figure 7:
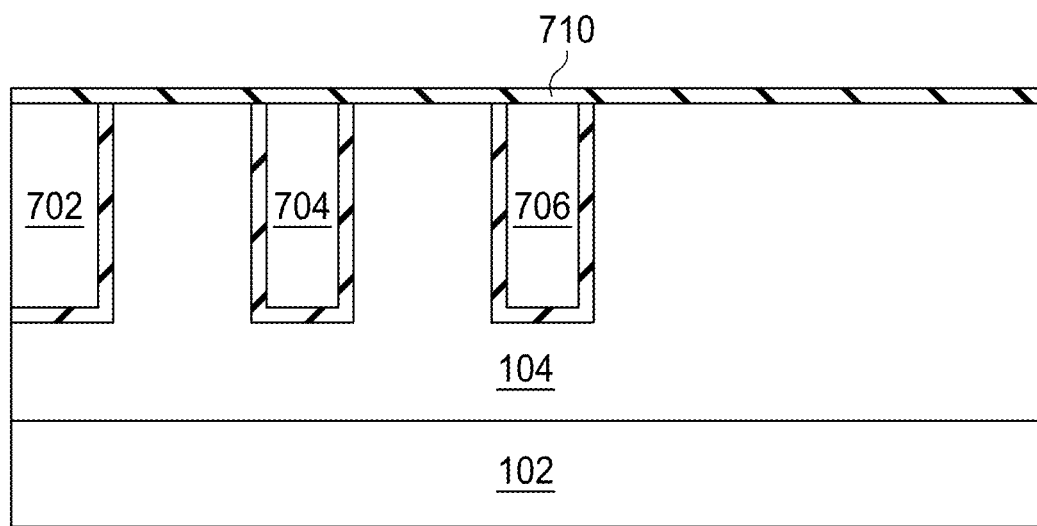
FIG. 7 illustrates a cross sectional view of the semiconductor device shown in FIG. 6 after an etch-back process is applied to the top surface shown in FIG. 6 in accordance with various embodiments of the present disclosure.

FIG. 7 illustrates a cross sectional view of the semiconductor device shown in FIG. 6 after an etch-back process is applied to the top surface shown in FIG. 6 in accordance with various embodiments of the present disclosure. A planarization process, such as chemical mechanical polishing (CMP) or etch back step, may be performed to planarize an upper surface of the gate electrode layer 602 until the thin dielectric layer is exposed. Thereafter, a polysilicon oxidation process is carried out to form a dielectric layer 710 to cover the polysilicon material in the trenches. As shown in FIG. 7, there may be three gates formed in the epitaxial layer after the CMP process, namely a first gate 702, a second gate 704 and a third gate 706.

Figure 8:
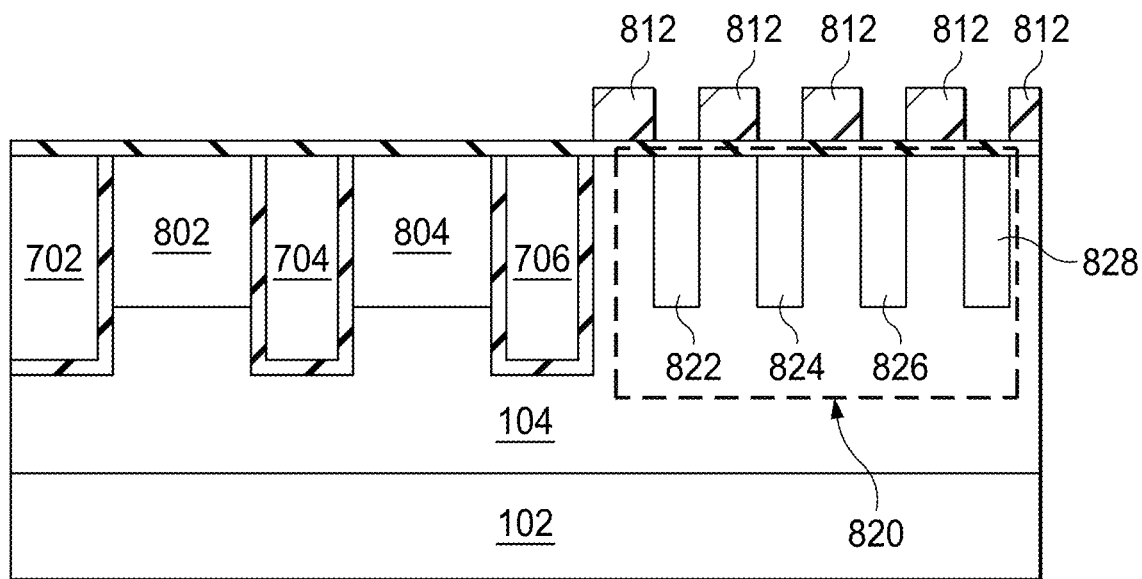
FIG. 8 illustrates a cross sectional view of the semiconductor device shown in FIG. 7 after body regions and a body ring structure are formed in the epitaxial layer in accordance with various embodiments of the present disclosure.

FIG. 8 illustrates a cross sectional view of the semiconductor device shown in FIG. 7 after body regions and a body ring structure are formed in the epitaxial layer in accordance with various embodiments of the present disclosure. A photoresist layer 812 is formed over the top surface of the semiconductor device using a spin on deposition and the like. In consideration with the location of the body ring structure of the power MOSFET 100 shown in FIG. 1, the photoresist layer 812 is patterned using suitable photolithography techniques. Body regions 802 and 804, and the body ring structure 820 may be formed in the upper portion of the epitaxial layer 104. In accordance with an embodiment, the body regions 802 and 804, and the body ring structure 820 may be formed by implanting appropriate p-type dopants such as boron, gallium, indium and the like.

In some embodiments, the body ring structure 820 is a concentric ring structure from a top view. As shown in the cross sectional view, the body ring structure 820 has four columns 822, 824, 826 and 828. In some embodiments, a bottommost surface of the body ring structure 820 is level with a bottommost surface of the body regions 802 and 804 as shown in FIG. 8.

In operation, the body ring structure 820 functions as a breakdown voltage enhancement and leakage prevention structure. The function of the breakdown voltage enhancement and leakage prevention structure will be described below with respect to FIG. 11.

Figure 9:
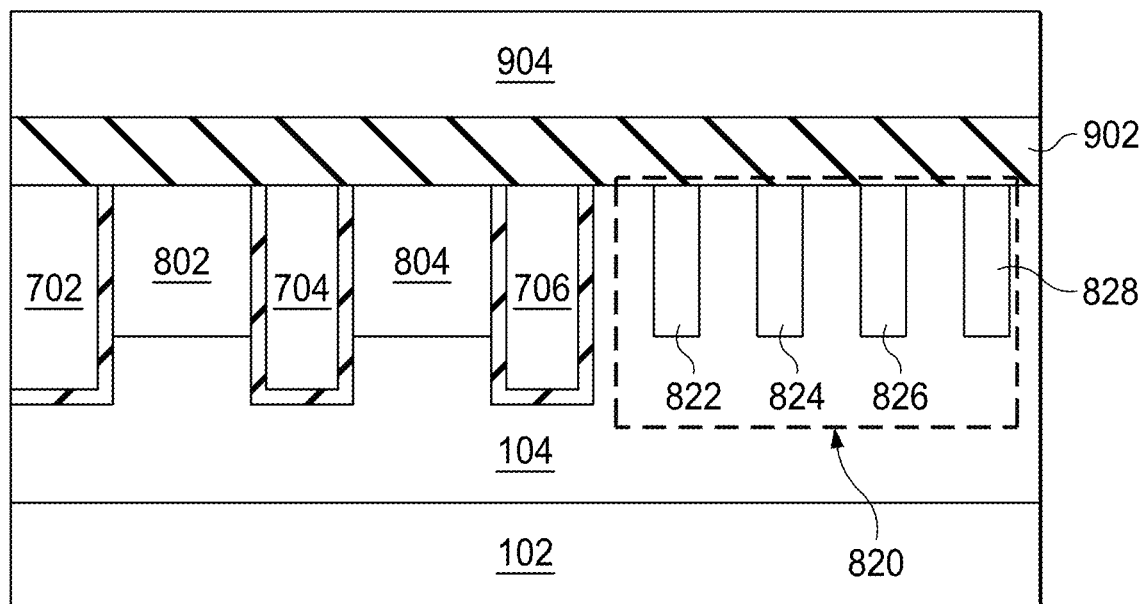
FIG. 9 illustrates a cross sectional view of the semiconductor device shown in FIG. 8 after an ESD bottom dielectric layer and an ESD layer are formed over the epitaxial layer in accordance with various embodiments of the present disclosure.

FIG. 9 illustrates a cross sectional view of the semiconductor device shown in FIG. 8 after an ESD bottom dielectric layer and an ESD layer are formed over the epitaxial layer in accordance with various embodiments of the present disclosure. The remaining photoresist layer 812 shown in FIG. 8 may be removed by using suitable photoresist stripping techniques. Thereafter, the ESD bottom dielectric layer 902 is deposited over the top surface of the semiconductor device using suitable deposition techniques such as PVD, CVD, ALD and the like. The ESD bottom dielectric layer 902 may be formed of commonly used dielectric materials such as oxides, nitrides, oxynitrides, high-k materials, combinations thereof, and multi-layers thereof.

The ESD layer 904 is deposited over the ESD bottom dielectric layer 902. The ESD layer 904 may be formed of polysilicon. In accordance with an embodiment, the ESD layer 904 is doped with p-type impurity ions such as Boron or the like. Doping of the p-type impurity ions in the ESD layer 904 preferably is implemented through a separate p-type impurity ion doping process after deposition of the ESD layer 904, or by depositing the ESD layer 904 while doping the p-type impurity ions.

Figure 10:
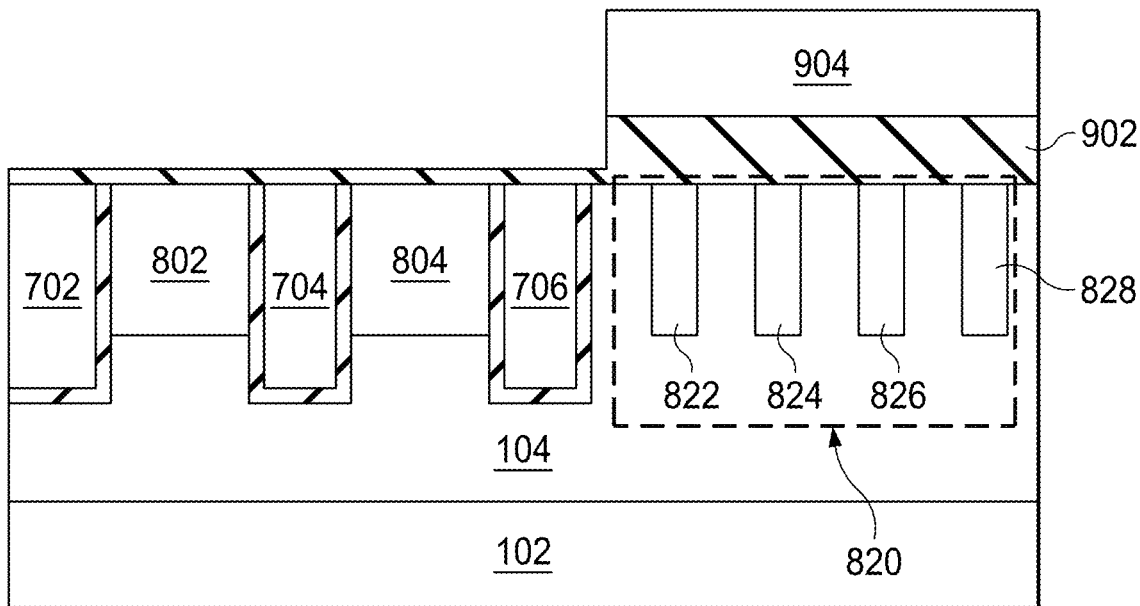
FIG. 10 illustrates a cross sectional view of the semiconductor device shown in FIG. 9 after an anisotropic etching process is applied to the ESD bottom dielectric layer and the ESD layer in accordance with various embodiments of the present disclosure.

FIG. 10 illustrates a cross sectional view of the semiconductor device shown in FIG. 9 after an anisotropic etching process is applied to the ESD bottom dielectric layer and the ESD layer in accordance with various embodiments of the present disclosure. An etching process is applied to the semiconductor device. As shown in FIG. 10, the portions of the ESD bottom dielectric layer and the ESD layer over the gates 702, 704 and 706 have been removed as a result.

Figure 11:
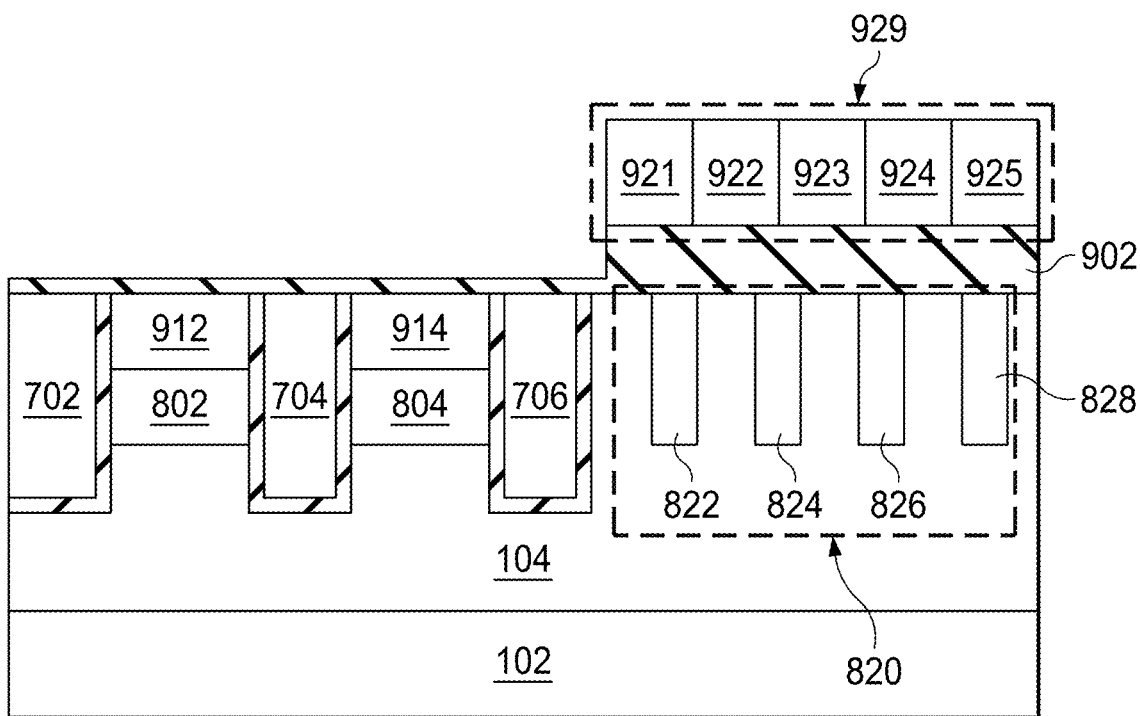
FIG. 11 illustrates a cross sectional view of the semiconductor device shown in FIG. 10 after source regions are formed over the body regions and n+ regions are formed in the ESD layer in accordance with various embodiments of the present disclosure.

FIG. 11 illustrates a cross sectional view of the semiconductor device shown in FIG. 10 after source regions are formed over the body regions and n+ regions are formed in the ESD layer in accordance with various embodiments of the present disclosure. As shown in FIG. 11, n+ regions 912 and 914 are formed over the body regions 802 and 804 respectively through suitable fabrication processes such as an ion implantation process. In accordance with an embodiment, the n+ regions 912 and 914 may function as a source region of the power MOSFET 100 shown in FIG. 1. At the same time, n+ regions 922 and 924 are formed in the ESD layer 904 shown in FIG. 10. The n+ regions are formed by implanting appropriate n-type dopants such as phosphorous, arsenic and the like.

As described above with respect to FIG. 9, the ESD layer 904 is a p-type layer once the ESD layer 904 is doped with p-type impurity ions. Since the n+ regions 922 and 924 are formed in the ESD layer 904, three p-type regions 921, 923 and 925 are formed in the ESD layer 904.

A shown in FIG. 11, a first p-type region 921, a first n+ region 922, a second p-type region 923, a second n+ region 924 and a third p-type region 925 are connected in cascade. The first p-type region 921, the first n+ region 922, the second p-type region 923, the second n+ region 924 and the third p-type region 925 form the gate-source ESD diode structure 929.

As shown in FIG. 11, the n+ regions and the p-type regions are formed in an alternating manner. The n+ regions and the p-type regions form a back-to-back ESD diode structure. The arrangement of the n+ regions and the p-type regions described above is merely an example, which should not unduly limit the scope of the claims. One of ordinary skill in the art would recognize many variations, alternatives, and modifications. For example, the back-to-back ESD diode structure may comprise a first n+ region, a first p-type region, a second n+ region, a second p-type region and a third n+ region connected in cascade.

As shown in FIG. 11, the gate-source ESD diode structure 929 and the body ring structure 820 are separated by the ESD bottom dielectric layer 902. The body ring structure 820 is configured to disperse an electric field on the gate-source ESD diode structure 929. The body ring structure 820 provides an electric field gradient that reduces the peak electric field at the edge of the gate-source ESD diode structure 929, thereby spreading the electric field more evenly. As a result, the body ring structure 820 is able to improve the performance of the power MOSFET 100.

Figure 12:
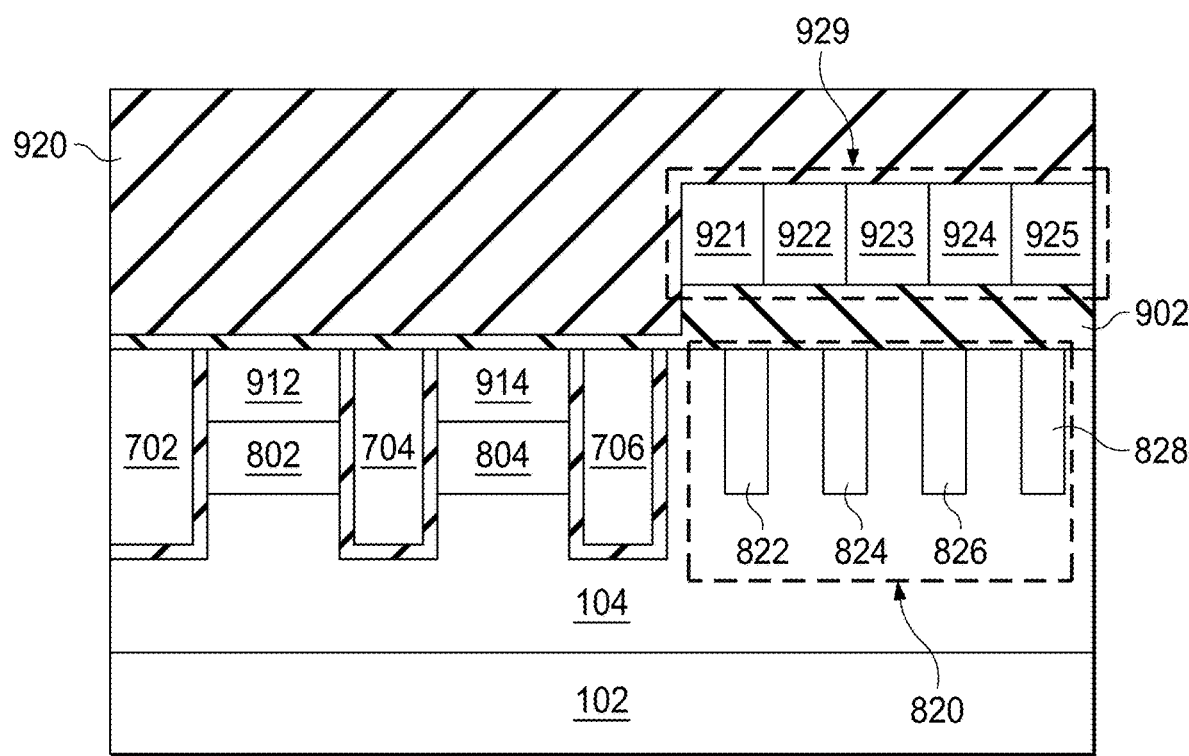
FIG. 12 illustrates a cross sectional view of the semiconductor device shown in FIG. 11 after a dielectric layer is formed over the epitaxial layer in accordance with various embodiments of the present disclosure.

FIG. 12 illustrates a cross sectional view of the semiconductor device shown in FIG. 11 after a dielectric layer is formed over the epitaxial layer in accordance with various embodiments of the present disclosure. The dielectric layer 920 is deposited over the epitaxial layer 104. The dielectric layer 920 may be alternatively referred to as an inter-layer dielectric (ILD) layer. The dielectric layer 920 may be a low-k dielectric layer having a low dielectric constant, for example, less than about 3.5. The dielectric layer 920 may also comprise a combination of materials, such as silicon nitride, silicon oxy-nitride, high-k dielectrics, low-k dielectrics, CVD poly-silicon or other dielectrics. The dielectric layer 920 may be deposited using suitable deposition techniques such as sputtering, CVD and the like.

Figure 13:
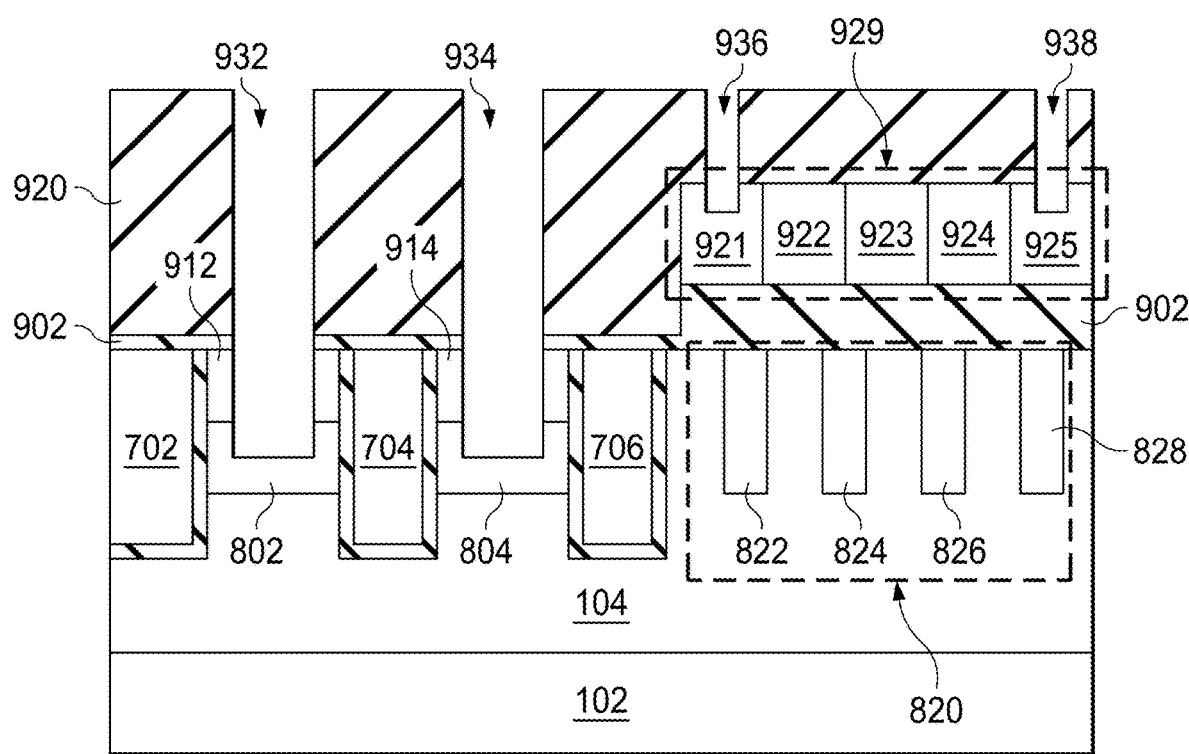
FIG. 13 illustrates a cross sectional view of the semiconductor device shown in FIG. 12 after an anisotropic etching process is applied to the dielectric layer to form a plurality of trenches in accordance with various embodiments of the present disclosure.

FIG. 13 illustrates a cross sectional view of the semiconductor device shown in FIG. 12 after an anisotropic etching process is applied to the dielectric layer to form a plurality of trenches in accordance with various embodiments of the present disclosure. A plurality of trenches 932, 934, 936 and 938 are formed by etching the dielectric layer 920 and the regions underneath the dielectric layer 920.

In some embodiments, trenches 932, 934 and 938 are source contact trenches. As shown in FIG. 13, the trench 932 extends through the dielectric layer 920, the source region 912 and partially through the body region 802. Likewise, the trench 934 extends through the dielectric layer 920, the source region 914 and partially through the body region 804. The trench 936 extends partially through the dielectric layer 920 and partially through the first p-type region 921. The trench 938 extends partially through the dielectric layer 920 and partially through the third p-type region 925.

Figure 14:
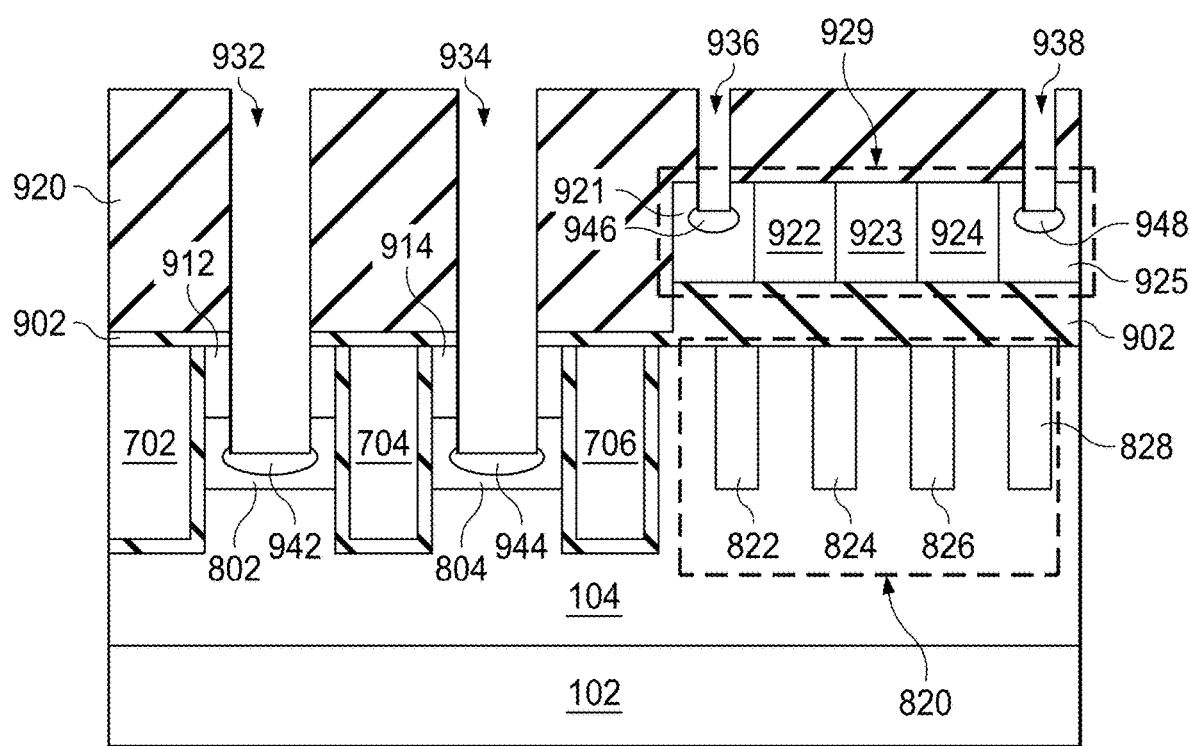
FIG. 14 illustrates a cross sectional view of the semiconductor device shown in FIG. 13 after a p+ region is formed in a bottom of each trench in accordance with various embodiments of the present disclosure.

FIG. 14 illustrates a cross sectional view of the semiconductor device shown in FIG. 13 after a p+ region is formed in a bottom of each trench in accordance with various embodiments of the present disclosure. A suitable implantation process such as a blanket ion implantation is performed. P-type impurity ions, such as boron ions and the like, are implanted into the body regions 802, 804, the first p-type region 921 and the third p-type region 925. Four p+ regions 942, 944, 946 and 948 are thus formed in the trenches respectively as shown in FIG. 14. The p+ regions 942, 944, 946 and 948 are specifically designed to further reduce the contact resistance.

Figure 15:
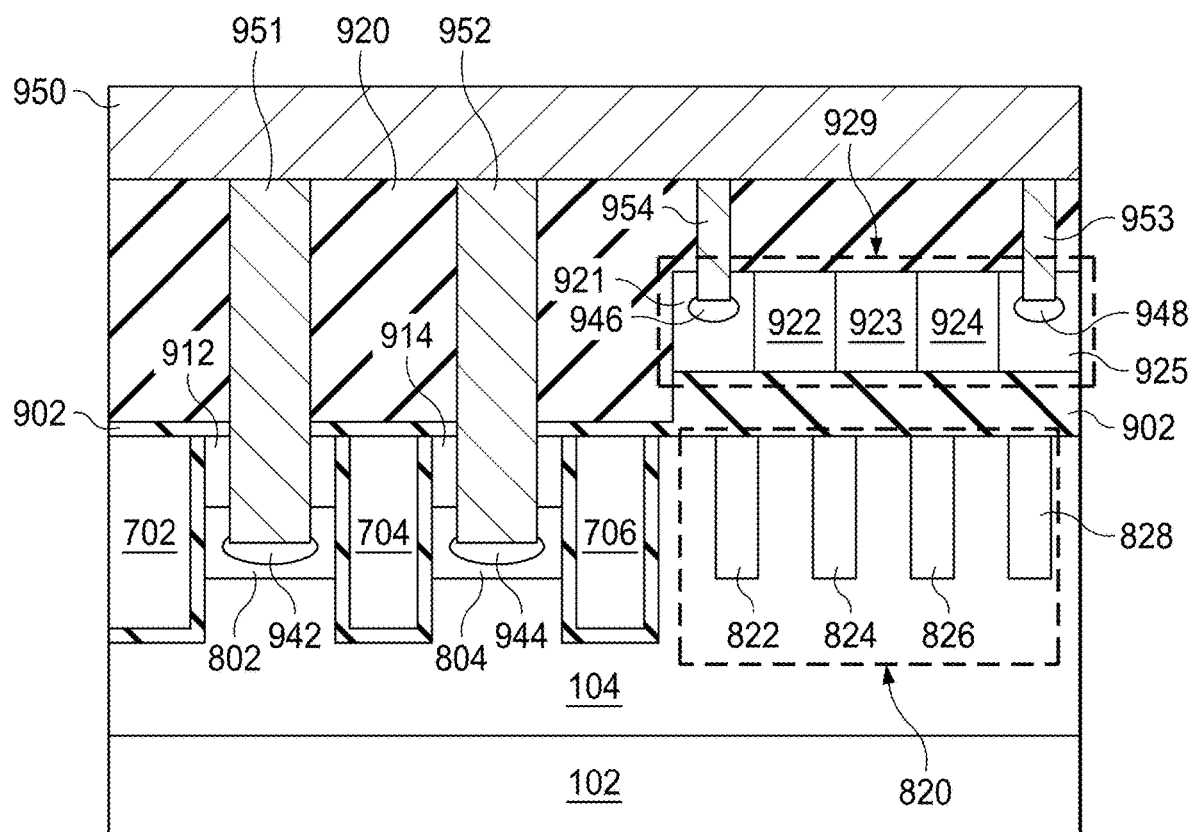
FIG. 15 illustrates a cross sectional view of the semiconductor device shown in FIG. 14 after metal materials are filled in the trenches of the semiconductor device in accordance with various embodiments of the present disclosure.

FIG. 15 illustrates a cross sectional view of the semiconductor device shown in FIG. 14 after metal materials are filled in the trenches of the semiconductor device in accordance with various embodiments of the present disclosure. A metallic material, which includes tungsten, titanium, aluminum, copper, any combinations thereof and/or the like, is filled into the trenches 932, 934, 936 and 938, forming contact plugs 951, 952, 953 and 954. The metallic material over the interlayer dielectric layer 920 forms a metal contact layer 950.

Figure 16:
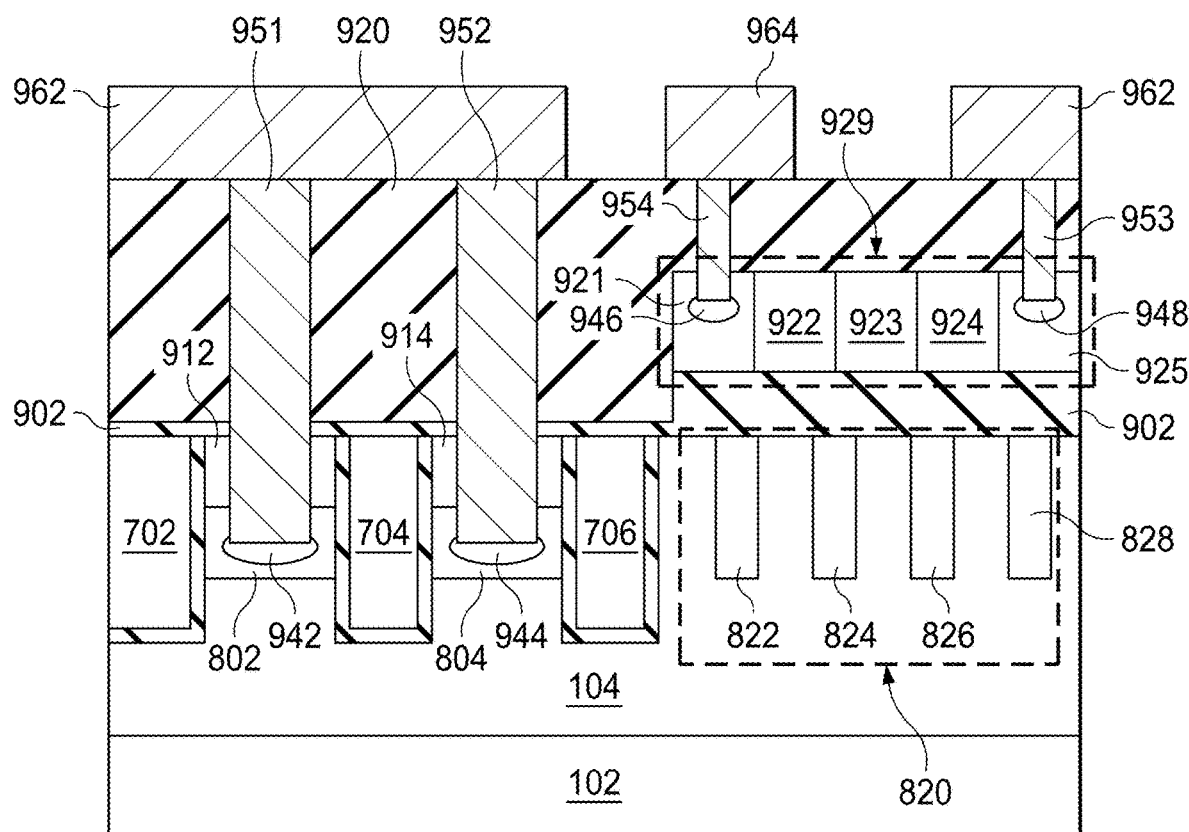
FIG. 16 illustrates a cross sectional view of the semiconductor device shown in FIG. 15 after source and gate contacts are formed in accordance with various embodiments of the present disclosure.

FIG. 16 illustrates a cross sectional view of the semiconductor device shown in FIG. 15 after source and gate contacts are formed in accordance with various embodiments of the present disclosure. In consideration with the location of the source contact and the gate contract of the power MOSFET 100 shown in FIG. 1, the metal contact layer 950 is patterned using suitable etching techniques.

As shown in FIG. 16, a first source contact plug 951 has a first terminal connected to the source contact 962, and a second terminal connected to the first source region 912, the p+ region 942 and the first body region 802. A second source contact plug 952 has a first terminal connected to the source contact 962, and a second terminal connected to the second source region 914, the p+ region 944 and the second body region 804. A gate contact plug 954 has a first terminal connected to the gate contact 964, and a second terminal connected to the p+ region 946 and a first terminal of the gate-source ESD diode structure 929. A third source contact plug 953 has a first terminal connected to the source contact 962, and a second terminal connected to the p+ region 948 and a second terminal of the gate-source ESD diode structure 929.

Figure 17:
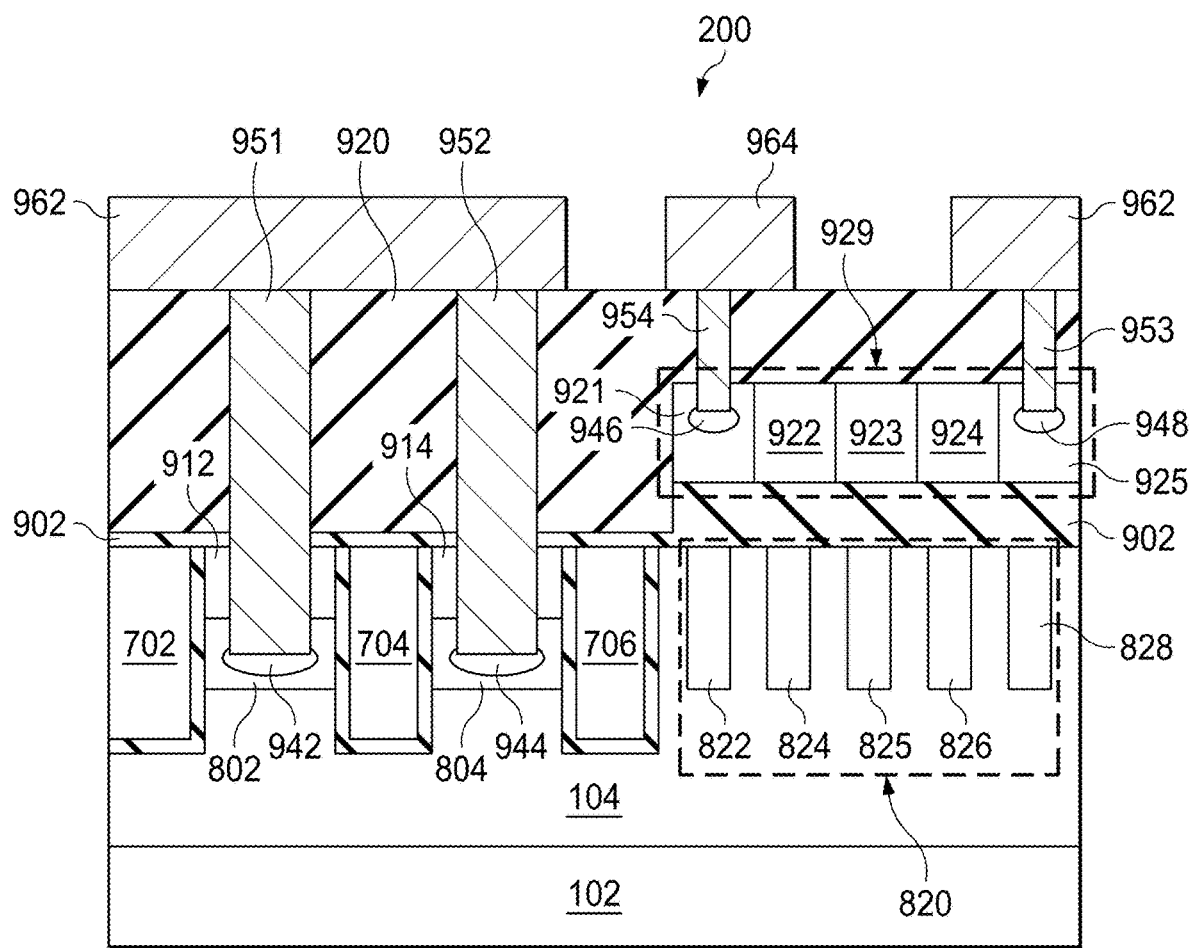
FIG. 17 illustrates a cross sectional view of a second implementation of the breakdown voltage enhancement and leakage prevention structure in accordance with various embodiments of the present disclosure.

FIG. 17 illustrates a cross sectional view of a second implementation of the breakdown voltage enhancement and leakage prevention structure in accordance with various embodiments of the present disclosure. The breakdown voltage enhancement and leakage prevention structure of the power MOSFET 200 is implemented as a body ring structure 820 as shown in FIG. 17. The body ring structure 820 shown in FIG. 17 is similar to that shown in FIG. 16 except that the body ring structure 820 shown in FIG. 17 has five columns 822, 824, 825, 826 and 828.

In some embodiments, a sidewall of the column 822 is vertically aligned with a sidewall of the first p-type region 921. A sidewall of the column 824 is vertically aligned with a sidewall of the first n+ region 922. A sidewall of the column 825 is vertically aligned with a sidewall of the second p-type region 923. A sidewall of the column 826 is vertically aligned with a sidewall of the second n+ region 924. A sidewall of the column 828 is vertically aligned with a sidewall of the third p-type region 925.

It should be recognized that while FIG. 17 illustrates the breakdown voltage enhancement and leakage prevention structure with five columns 822, 824, 825, 826 and 828, the breakdown voltage enhancement and leakage prevention structure could accommodate any number of columns.

Figure 18:
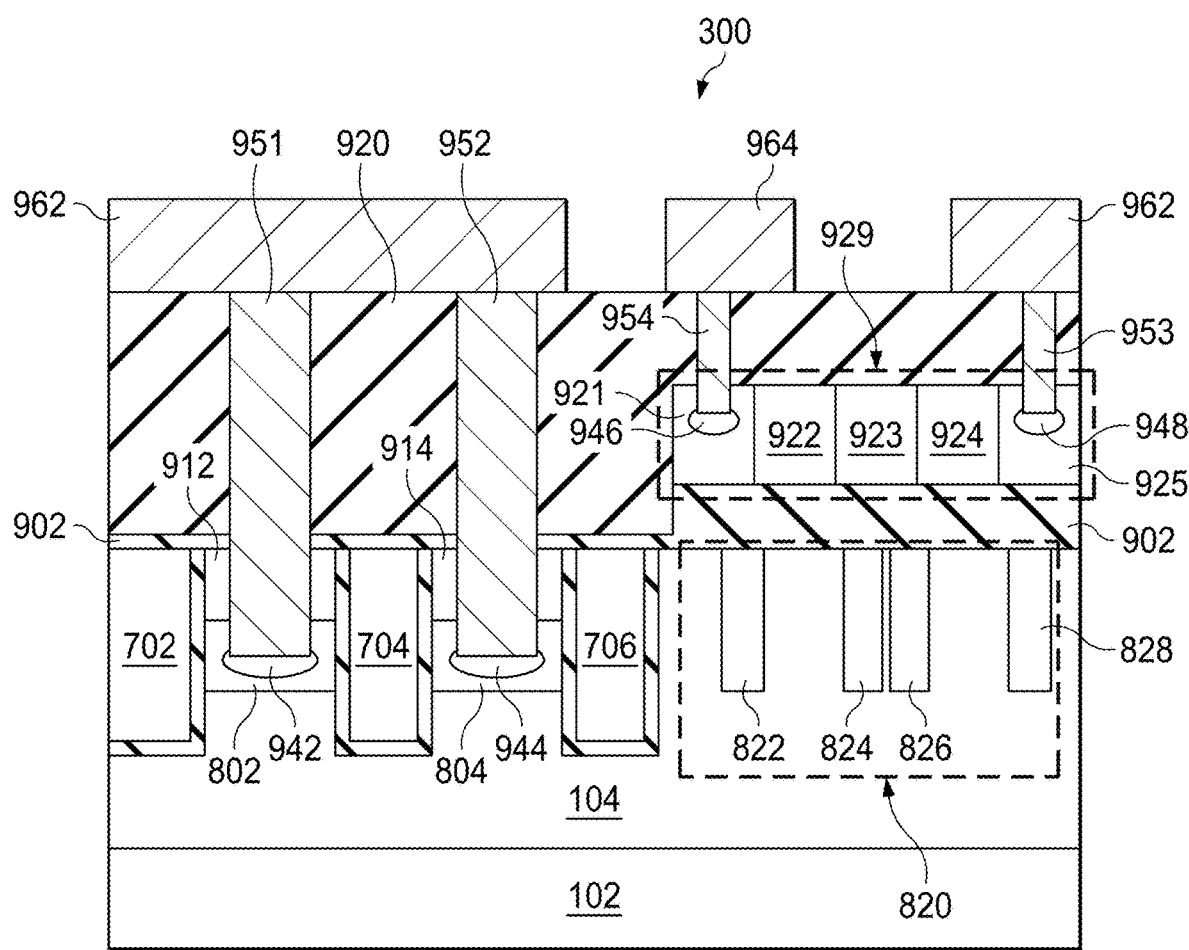
FIG. 18 illustrates a cross sectional view of a third implementation of the breakdown voltage enhancement and leakage prevention structure in accordance with various embodiments of the present disclosure.

FIG. 18 illustrates a cross sectional view of a third implementation of the breakdown voltage enhancement and leakage prevention structure in accordance with various embodiments of the present disclosure. The breakdown voltage enhancement and leakage prevention structure of the power MOSFET 300 is implemented as a body ring structure 820 as shown in FIG. 18. The body ring structure 820 shown in FIG. 18 is similar to that shown in FIG. 16 except that the four columns 822, 824, 826 and 828 of the body ring structure 820 are vertically aligned with respective ESD diode regions.

In some embodiments, a sidewall of the column 822 is vertically aligned with a first sidewall of the first n+ region 922. A sidewall of the column 824 is vertically aligned with a second sidewall of the first n+ region 922. A sidewall of the column 826 is vertically aligned with a first sidewall of the second n+ region 924. A sidewall of the column 828 is vertically aligned with a second sidewall of the second n+ region 924.

Figure 19:
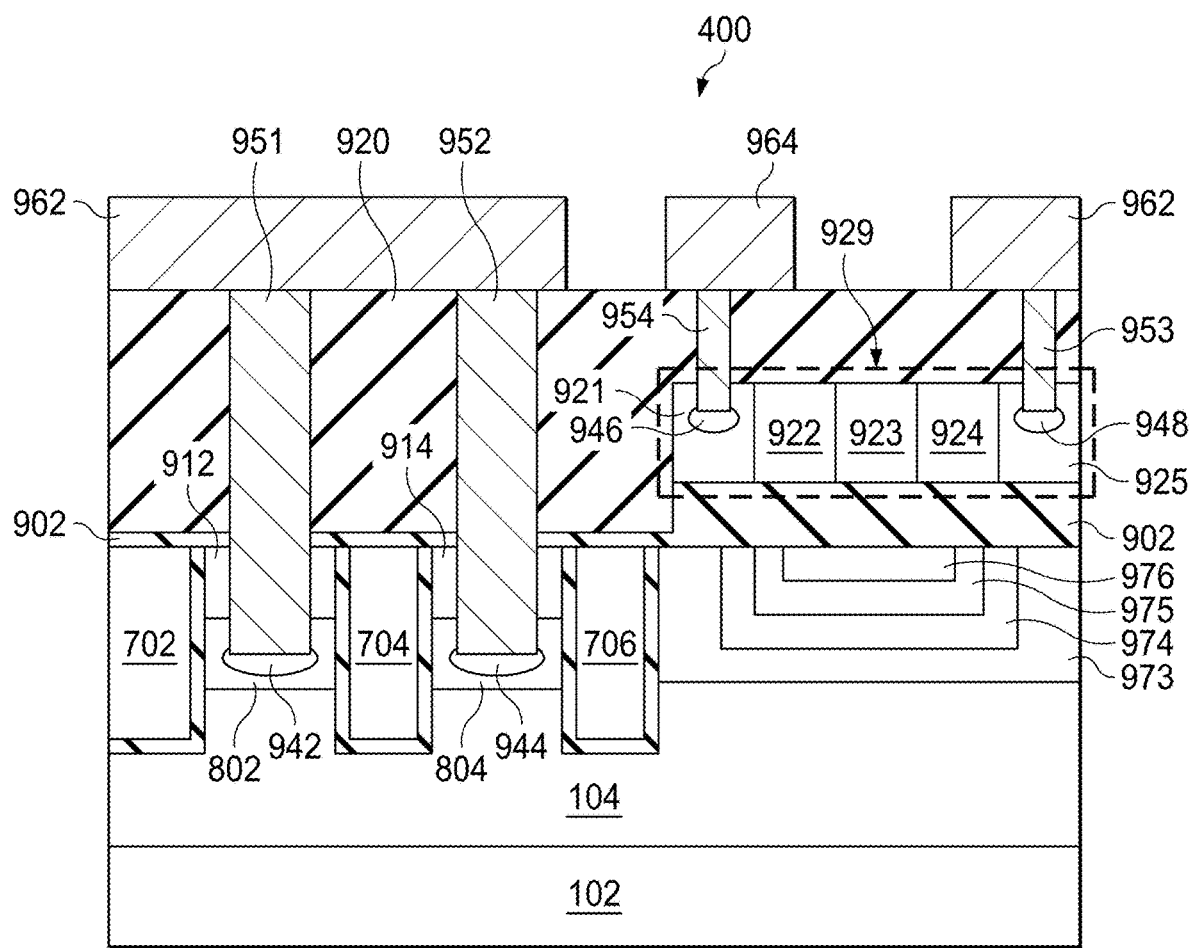
FIG. 19 illustrates a cross sectional view of a fourth implementation of the breakdown voltage enhancement and leakage prevention structure in accordance with various embodiments of the present disclosure.

FIG. 19 illustrates a cross sectional view of a fourth implementation of the breakdown voltage enhancement and leakage prevention structure in accordance with various embodiments of the present disclosure. The breakdown voltage enhancement and leakage prevention structure of the power MOSFET 400 comprises a plurality of n-type wells 974, 976 and a plurality of p-type wells 973, 975 arranged in an alternating manner. The plurality of n-type wells and the plurality of p-type wells are configured to disperse an electric field on the gate-source ESD diode structure 929. As shown in FIG. 19, the plurality of n-type wells and the plurality of p-type wells, and the gate-source ESD diode structure 929 are separated by a dielectric layer.

The p-n-p-n-p well structure shown in FIG. 19 can achieve higher levels of reliability and durability in the power MOSFET 400, thereby improving the ESD protection design.

The arrangement of the n wells and the wells described above is merely an example, which should not unduly limit the scope of the claims. One of ordinary skill in the art would recognize many variations, alternatives, and modifications. For example, an n-p-n-p-n well structure can be used to replace the well structure shown in FIG. 19. The n-p-n-p-n well structure fully covers the area underneath the gate-source ESD diode structure 929. This features multiple p-n diodes that enhance the electric characteristics of the power MOSFET 400, providing stronger protection against ESD events.

FIGS. 20-24 illustrate cross sectional views of intermediate steps of fabricating the breakdown voltage enhancement and leakage prevention structure shown in FIG. 19 in accordance with various embodiments of the present disclosure.

Figure 20:
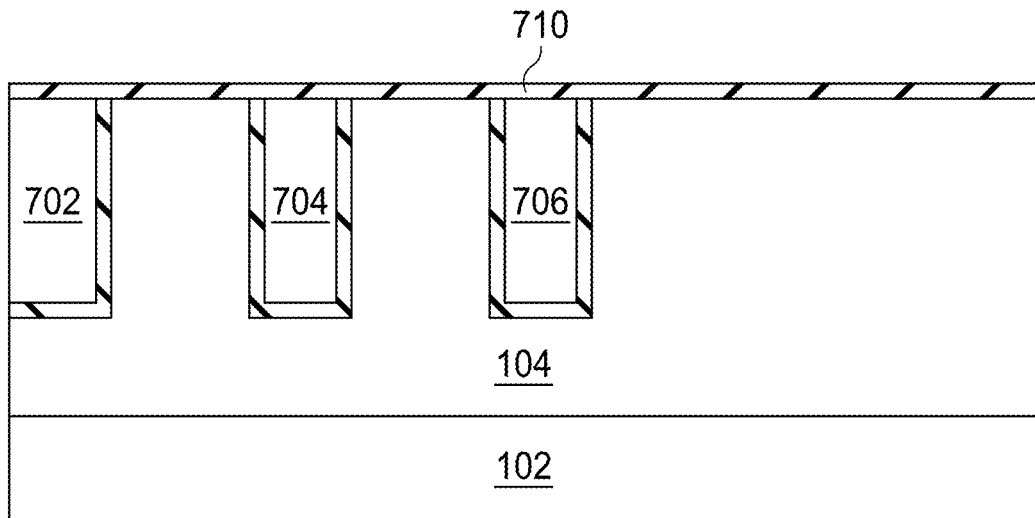
FIG. 20 illustrates a cross sectional view of a semiconductor device after the gates are covered by a dielectric layer in accordance with various embodiments of the present disclosure.

FIG. 20 illustrates a cross sectional view of a semiconductor device after the gates are covered by a dielectric layer in accordance with various embodiments of the present disclosure. The cross sectional view shown in FIG. 20 is similar to that shown in FIG. 7, and hence is not discussed again herein to avoid repetition.

Figure 21:
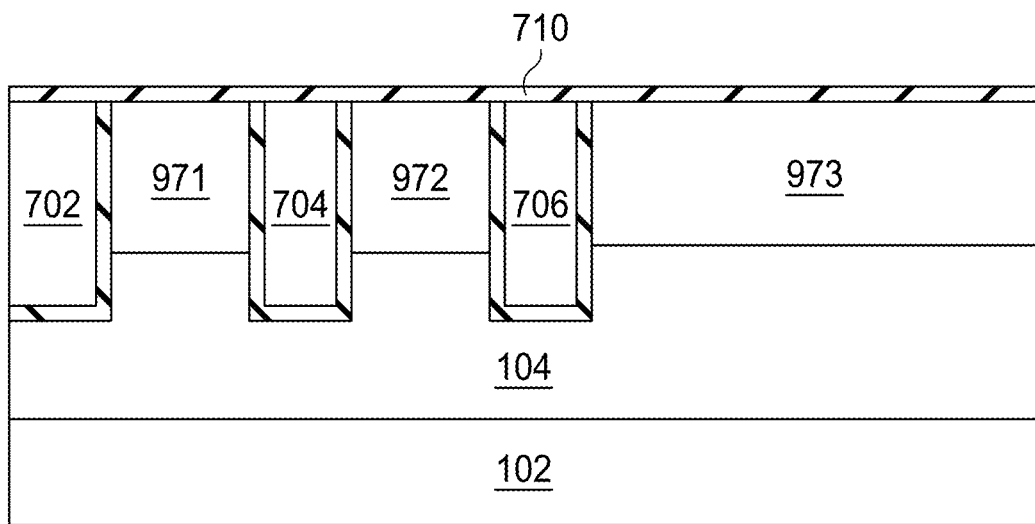
FIG. 21 illustrates a cross sectional view of the semiconductor device shown in FIG. 20 after body regions are formed in the epitaxial layer in accordance with various embodiments of the present disclosure.

FIG. 21 illustrates a cross sectional view of the semiconductor device shown in FIG. 20 after body regions are formed in the epitaxial layer in accordance with various embodiments of the present disclosure. The body regions 971, 972 and 973 are p-type regions. The p-type regions 971, 972 and 973 are formed in the epitaxial layer 104 through suitable semiconductor doping techniques such as an ion implantation process. In some embodiments, appropriate p-type dopants such as boron, gallium, indium and/or the like are implanted into the epitaxial layer 104 to form the body regions 971, 972 and 973. The body region 973 is alternatively referred to as a first p-type well.

Figure 22:
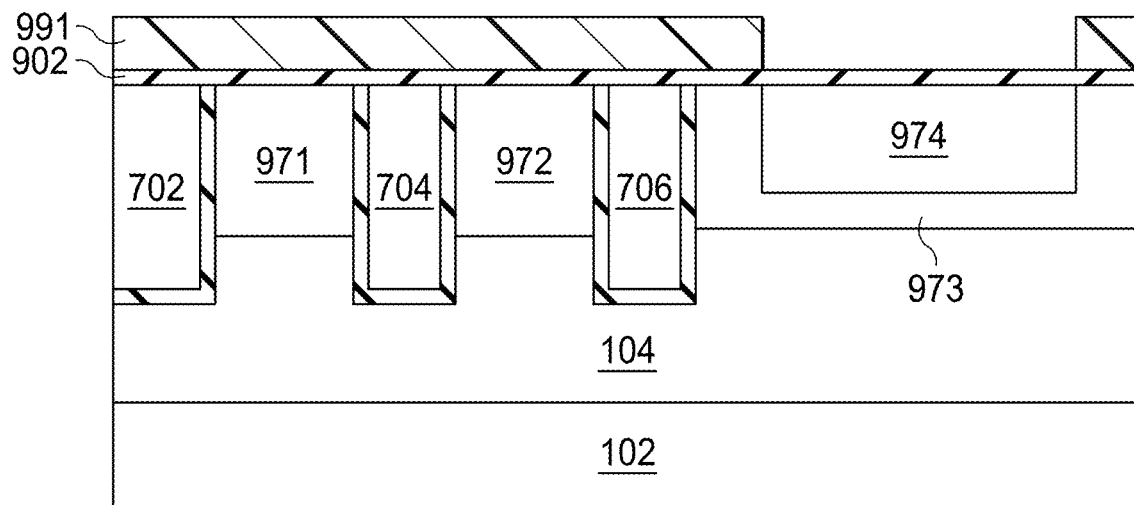
FIG. 22 illustrates a cross sectional view of the semiconductor device shown in FIG. 21 after a first n-type well is formed in the first p-type well in accordance with various embodiments of the present disclosure.

FIG. 22 illustrates a cross sectional view of the semiconductor device shown in FIG. 21 after a first n-type well is formed in the first p-type well in accordance with various embodiments of the present disclosure. A photoresist layer 991 is deposited over the semiconductor device using a spin on deposition and the like. The photoresist layer 991 is exposed and developed such that only the portion over the first n-type well 974 has been removed.

The first n-type well 974 is formed by implanting n-type dopants such as phosphorous, arsenic and the like. Alternatively, the first n-type well 974 can be formed by a diffusion process. As shown in FIG. 22, the first n-type well 974 is surrounded by the first p-type well 973.

Figure 23:
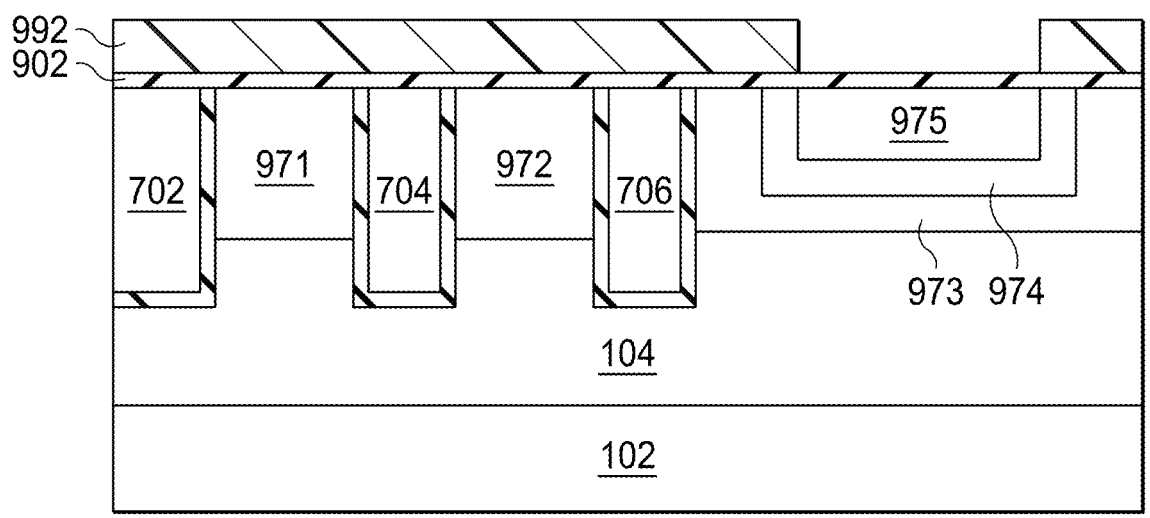
FIG. 23 illustrates a cross sectional view of the semiconductor device shown in FIG. 22 after a second p-type well is formed in the first n-type well in accordance with various embodiments of the present disclosure.

FIG. 23 illustrates a cross sectional view of the semiconductor device shown in FIG. 22 after a second p-type well is formed in the first n-type well in accordance with various embodiments of the present disclosure. A photoresist layer 992 is deposited over the semiconductor device using a spin on deposition and the like. The photoresist layer 992 is exposed and developed such that only the portion over the second p-type well 975 has been removed.

The second p-type well 975 is formed by implanting p-type dopants such as boron, gallium, aluminum, indium and the like. Alternatively, the second p-type well 975 can be formed by a diffusion process. As shown in FIG. 23, the second p-type well 975 is surrounded by the first n-type well 974.

Figure 24:
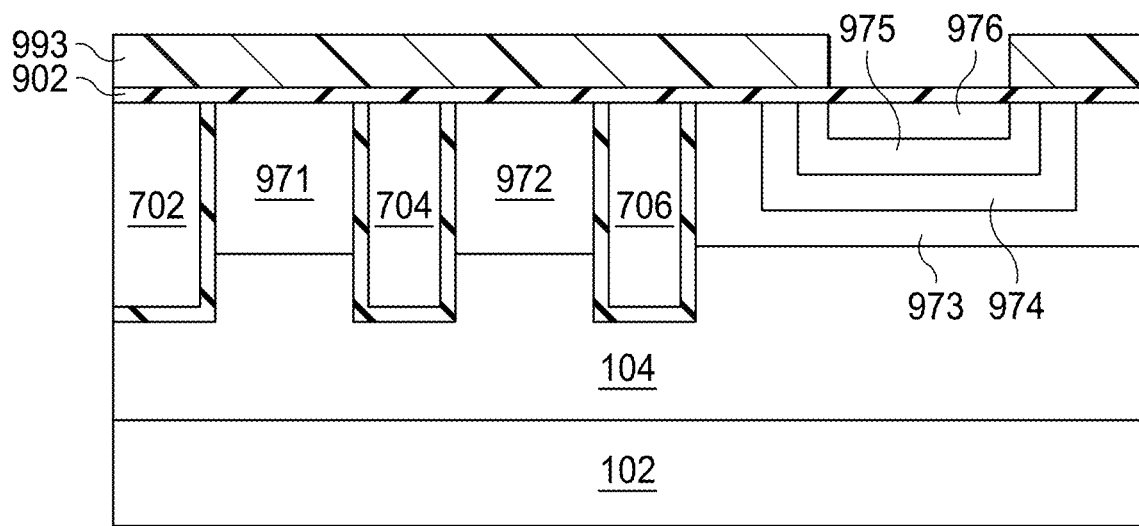
FIG. 24 illustrates a cross sectional view of the semiconductor device shown in FIG. 23 after a second n-type well is formed in the p-type well in accordance with various embodiments of the present disclosure.

FIG. 24 illustrates a cross sectional view of the semiconductor device shown in FIG. 23 after a second n-type well is formed in the p-type well in accordance with various embodiments of the present disclosure. A photoresist layer 993 is deposited over the semiconductor device using a spin on deposition and the like. The photoresist layer 993 is exposed and developed such that only the portion over the second n-type well 976 has been removed.

The second n-type well 976 is formed by implanting n-type dopants such as phosphorous, arsenic and the like. Alternatively, the second n-type well 976 can be formed by a diffusion process. As shown in FIG. 24, the second n-type well 976 is surrounded by the second p-type well 975.

One skilled in the art will recognize that FIG. 24 illustrates an ideal profile. The dimensions of the wells may vary after subsequent fabrication processes.

Figure 25:
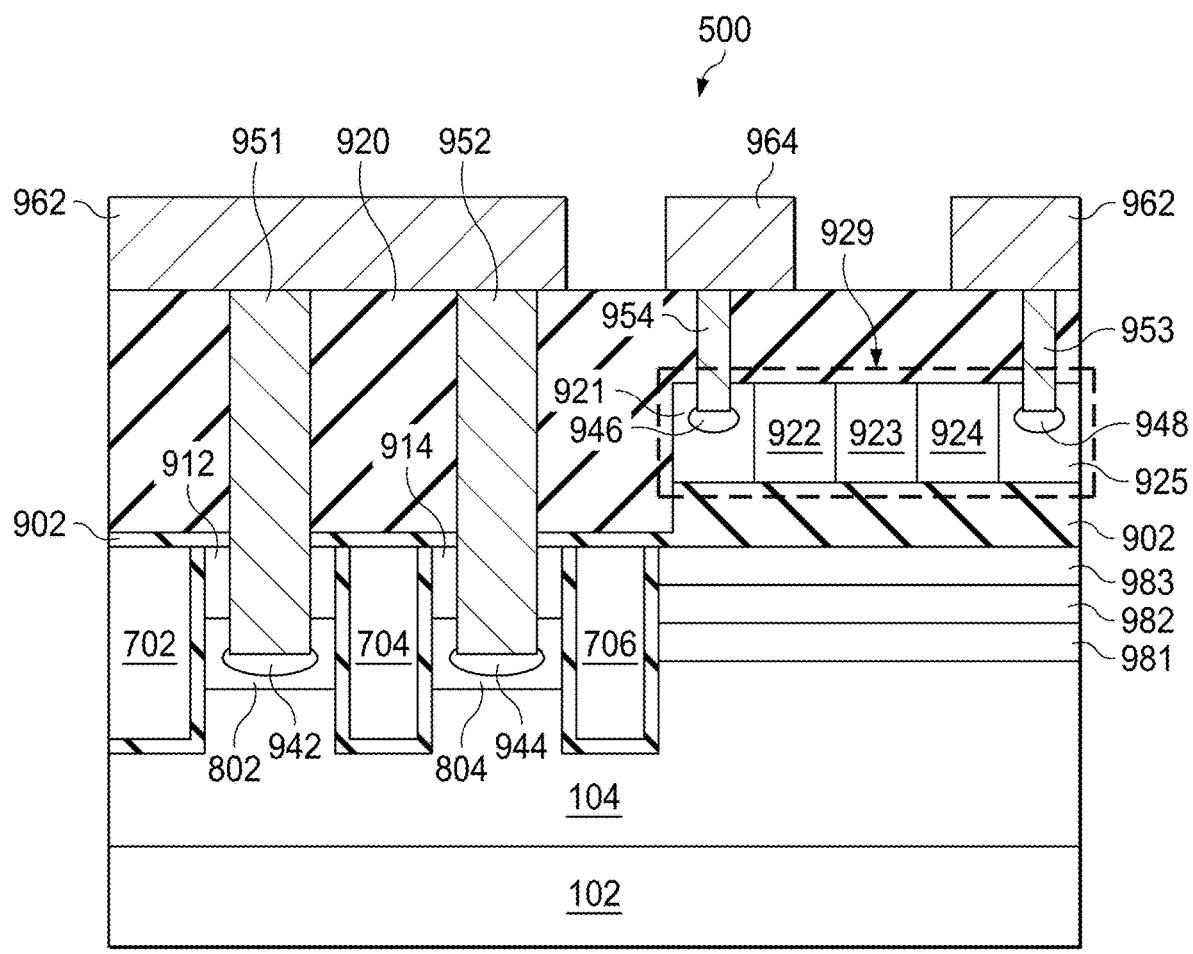
FIG. 25 illustrates a cross sectional view of a fifth implementation of the breakdown voltage enhancement and leakage prevention structure in accordance with various embodiments of the present disclosure.

FIG. 25 illustrates a cross sectional view of a fifth implementation of the breakdown voltage enhancement and leakage prevention structure in accordance with various embodiments of the present disclosure. The breakdown voltage enhancement and leakage prevention structure of the power MOSFET 500 comprises two n-type wells 981, 983 and one p-type well 982 arranged in an alternating manner. The n-type wells and the p-type well are configured to disperse an electric field on the gate-source ESD diode structure 929. The n-type wells and the p-type well, and the gate-source ESD diode structure 929 are separated by a dielectric layer.

As shown in FIG. 25, a first n-type well 981 is formed in the epitaxial layer 104. A first p-type well 982 is formed in the first n-type well 981. A width of the first p-type well 982 is equal to a width of the first n-type well 981. A second n-type well 983 is formed in the first p-type well 982. A width of the second n-type well 983 is equal to the width of the first p-type well 982.

It should be recognized that while FIG. 25 illustrates the breakdown voltage enhancement and leakage prevention structure with three wells 981, 982 and 983, the breakdown voltage enhancement and leakage prevention structure could accommodate any number of wells arranged in an alternating manner.

Figure 26:
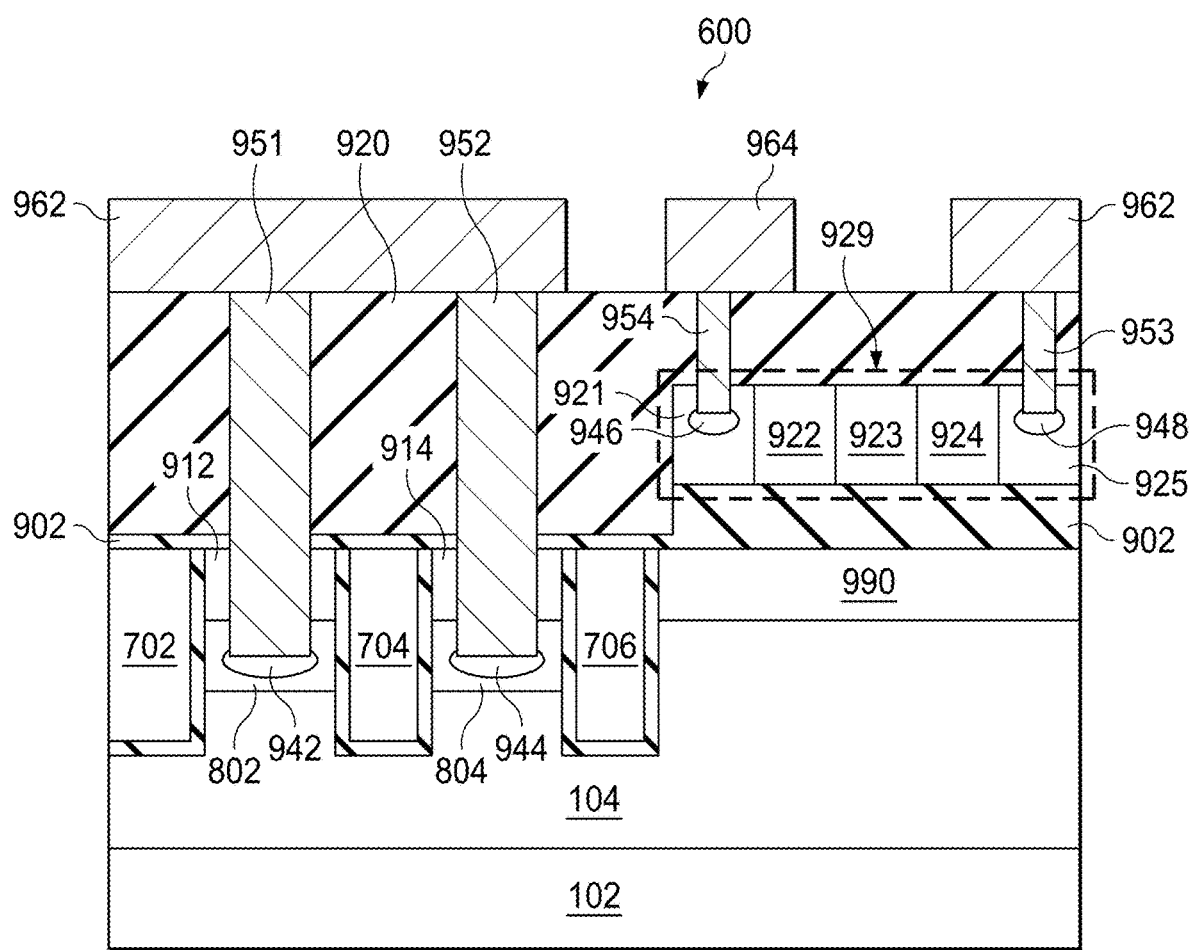
FIG. 26 illustrates a cross sectional view of a sixth implementation of the breakdown voltage enhancement and leakage prevention structure in accordance with various embodiments of the present disclosure.

FIG. 26 illustrates a cross sectional view of a sixth implementation of the breakdown voltage enhancement and leakage prevention structure in accordance with various embodiments of the present disclosure. The breakdown voltage enhancement and leakage prevention structure of the power MOSFET 600 is a reduced surface field (RESURF) structure 990. The RESURF structure is a well-known mechanism to improve the breakdown voltage of high voltage MOSFETs.

As shown in FIG. 26, the RESURF structure 990 is placed beneath the gate-source ESD diode structure 929. The RESURF structure 990 and the gate-source ESD diode structure 929 are separated by a dielectric layer. This RESURF structure 990 helps to disperse the electric field on the gate-source ESD diode structure 929, thereby reducing the risk of electrical breakdown and leakage.

Figure 27:
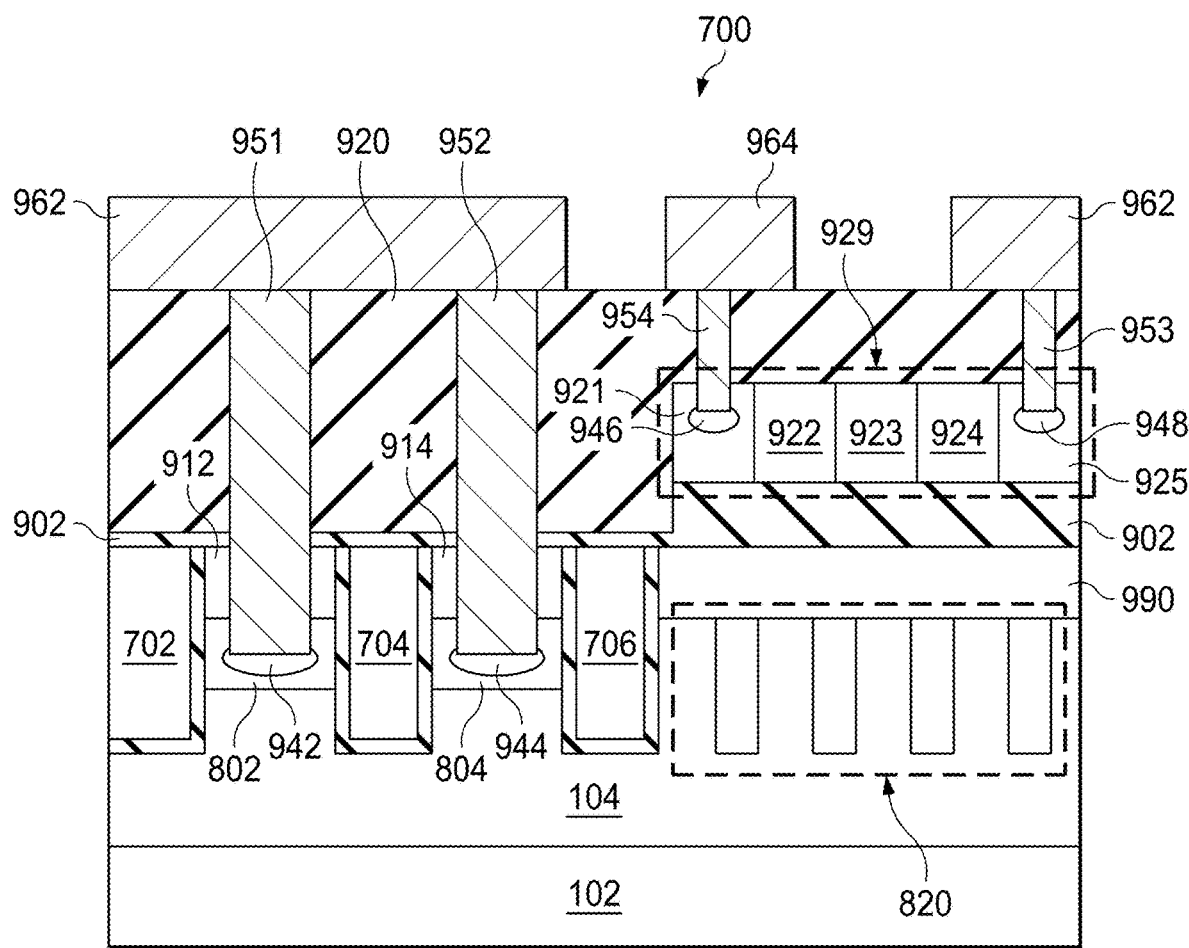
FIG. 27 illustrates a cross sectional view of a seventh implementation of the breakdown voltage enhancement and leakage prevention structure in accordance with various embodiments of the present disclosure.

FIG. 27 illustrates a cross sectional view of a seventh implementation of the breakdown voltage enhancement and leakage prevention structure in accordance with various embodiments of the present disclosure. The breakdown voltage enhancement and leakage prevention structure of the power MOSFET 700 comprises a RESURF structure 990 and a body ring structure 820.

The RESURF structure 990 and the body ring structure 820 are configured to disperse an electric field on the gate-source ESD diode structure 929. The body ring structure 820 is a concentric ring structure formed in the epitaxial layer 104. The RESURF structure 990 and the gate-source ESD diode structure 929 are separated by a dielectric layer. As shown in FIG. 27, the RESURF structure 990 is between the gate-source ESD diode structure 929 and the body ring structure 820.

Figure 28:
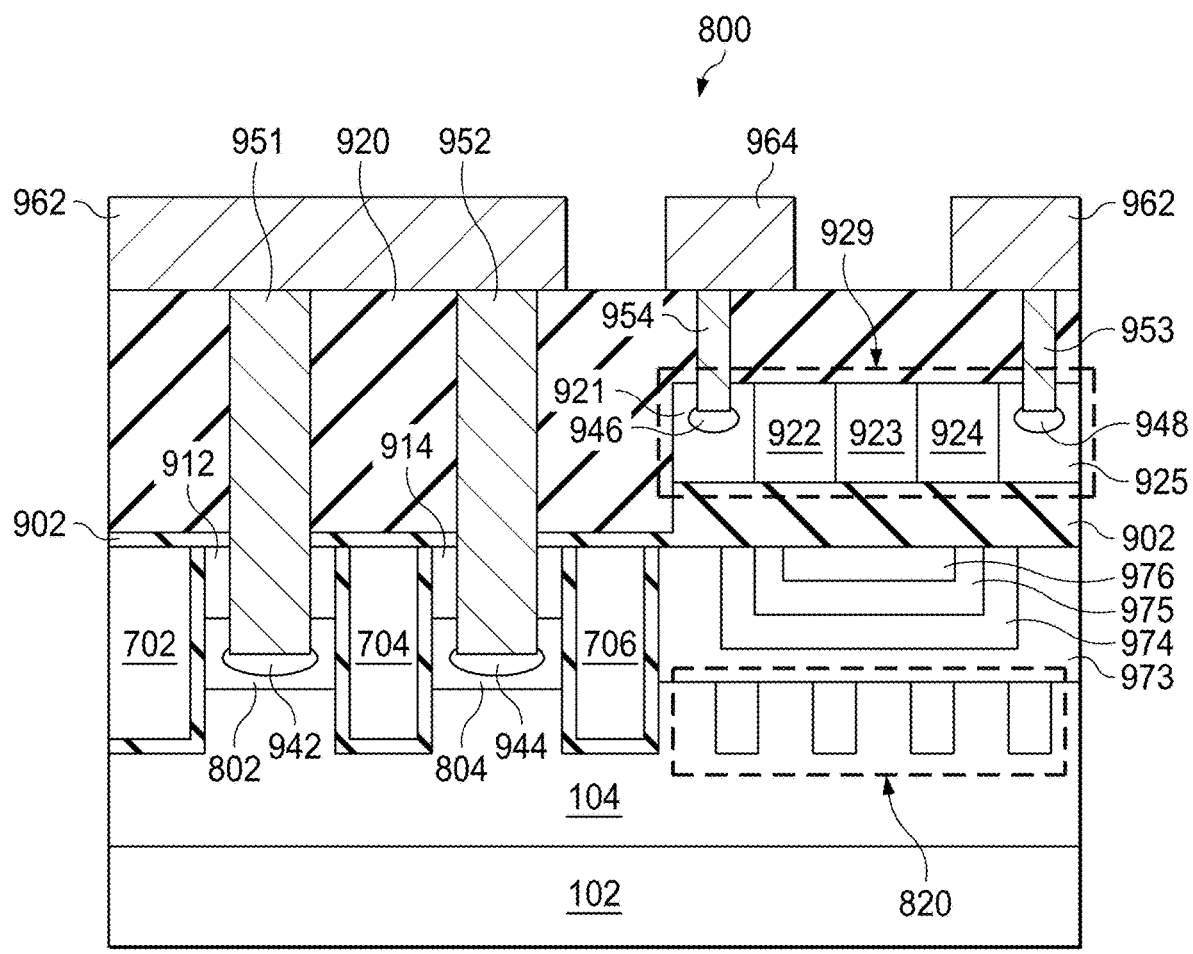
FIG. 28 illustrates a cross sectional view of an eighth implementation of the breakdown voltage enhancement and leakage prevention structure in accordance with various embodiments of the present disclosure.

FIG. 28 illustrates a cross sectional view of an eighth implementation of the breakdown voltage enhancement and leakage prevention structure in accordance with various embodiments of the present disclosure. The breakdown voltage enhancement and leakage prevention structure of the power MOSFET 800 comprises a plurality of n-type wells, a plurality of p-type wells and a body ring structure 820. The plurality of n-type wells and the plurality of p-type wells shown in FIG. 28 are similar to those shown in FIG. 19, and hence are not discussed again herein.

The plurality of n-type wells and the plurality of p-type wells are arranged in an alternating manner. The plurality of n-type wells, the plurality of p-type wells and the body ring structure 820 are configured to disperse an electric field on the gate-source ESD diode structure 929. The body ring structure 820 is a concentric ring structure formed in the epitaxial layer 104. The plurality of n-type wells and the plurality of p-type wells, and the gate-source ESD diode structure 929 are separated by a dielectric layer. The plurality of n-type wells and the plurality of p-type wells are between the gate-source ESD diode structure 929 and the body ring structure 820.

Figure 29:
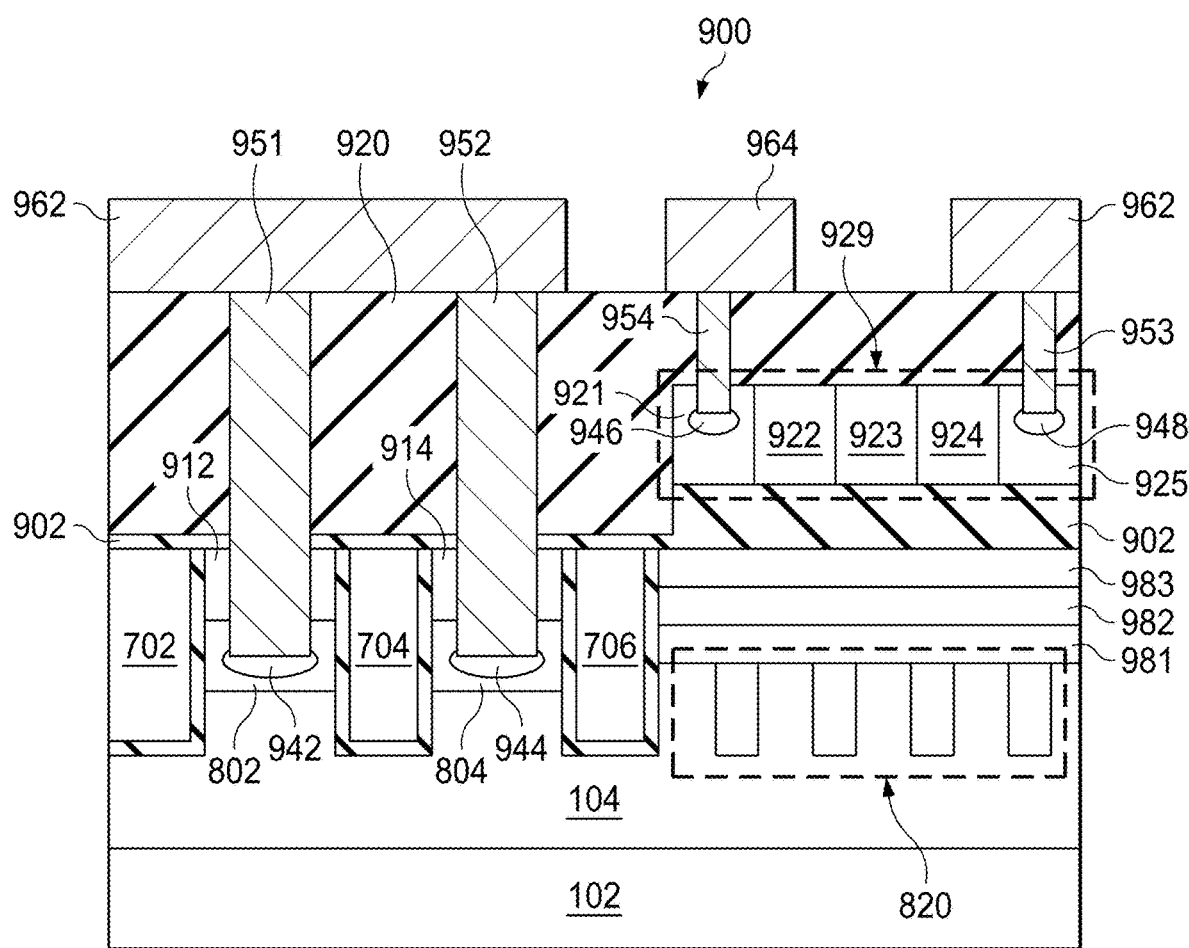
FIG. 29 illustrates a cross sectional view of a ninth implementation of the breakdown voltage enhancement and leakage prevention structure in accordance with various embodiments of the present disclosure.

FIG. 29 illustrates a cross sectional view of a ninth implementation of the breakdown voltage enhancement and leakage prevention structure in accordance with various embodiments of the present disclosure. The breakdown voltage enhancement and leakage prevention structure of the power MOSFET 900 comprises a plurality of n-type wells, a plurality of p-type wells and a body ring structure 820. The plurality of n-type wells and the plurality of p-type wells shown in FIG. 29 are similar to those shown in FIG. 25, and hence are not discussed again herein.

The plurality of n-type wells and the plurality of p-type wells are arranged in an alternating manner. The plurality of n-type wells, the plurality of p-type wells and the body ring structure 820 are configured to disperse an electric field on the gate-source ESD diode structure 929. The body ring structure 820 is a concentric ring structure formed in the epitaxial layer 104. The plurality of n-type wells and the plurality of p-type wells, and the gate-source ESD diode structure are separated by a dielectric layer. As shown in FIG. 29, the plurality of n-type wells and the plurality of p-type wells are between the gate-source ESD diode structure 929 and the body ring structure 820.

Figure 30:
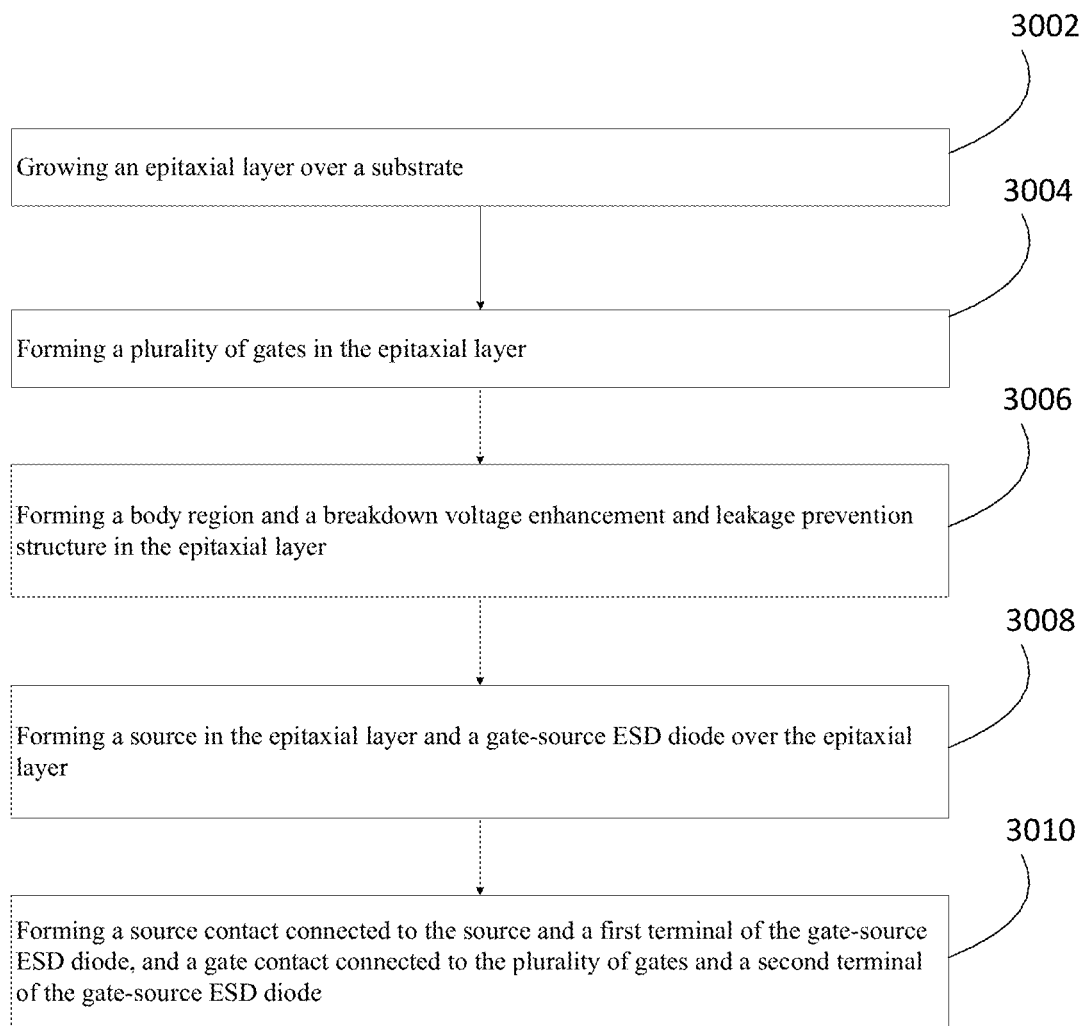
FIG. 30 illustrates a flow chart of a method for fabricating the power MOSFET shown in FIG. 1 in accordance with various embodiments of the present disclosure.

FIG. 30 illustrates a flow chart of a method for fabricating the power MOSFET shown in FIG. 1 in accordance with various embodiments of the present disclosure. This flow-chart shown in FIG. 30 is merely an example, which should not unduly limit the scope of the claims. One of ordinary skill in the art would recognize many variations, alternatives, and modifications. For example, various steps illustrated in FIG. 30 may be added, removed, replaced, rearranged and repeated.

At step 3002, an epitaxial layer is grown over a substrate.

At step 3004, a plurality of gates is formed in the epitaxial layer.

At step 3006, a body region and a breakdown voltage enhancement and leakage prevention structure are formed in the epitaxial layer.

At step 3008, a source is formed in the epitaxial layer and a gate-source ESD diode structure is formed over the epitaxial layer.

At step 3010, a source contact is formed to be connected to the source and a first terminal of the gate-source ESD diode structure, and a gate contact is formed to be connected to the plurality of gates and a second terminal of the gate-source ESD diode structure.

The step of forming the breakdown voltage enhancement and leakage prevention structure in the epitaxial layer comprises forming a RESURF structure through an implantation process, wherein the RESURF structure is in an upper portion of the epitaxial layer, and the RESURF structure and the gate-source ESD diode structure are separated by a dielectric layer.

The step of forming the breakdown voltage enhancement and leakage prevention structure in the epitaxial layer comprises forming a body ring structure through an implantation process, wherein the body ring structure is a concentric ring structure, and the body ring structure and the gate-source ESD diode structure are separated by a dielectric layer.

The step of forming the breakdown voltage enhancement and leakage prevention structure in the epitaxial layer comprises forming a first p-type well in the epitaxial layer, forming a first n-type well in the first p-type well, and wherein the first n-type well is surrounded by the first p-type well, forming a second p-type well in the first n-type well, and wherein the second p-type well is surrounded by the first n-type well, and forming a second n-type well in the second p-type well, and wherein the second n-type well is surrounded by the second p-type well.

The step of forming the breakdown voltage enhancement and leakage prevention structure in the epitaxial layer comprises forming a first n-type well in the epitaxial layer, forming a first p-type well in the first n-type well, and wherein a width of the first p-type well is equal to a width of the first n-type well, and forming a second n-type well in the first p-type well, and wherein a width of the second n-type well is equal to the width of the first p-type well.

The step of forming the gate-source ESD diode structure over the epitaxial layer comprises forming a plurality of n-type regions and a plurality of p-type regions in an alternating manner in an interlayer dielectric layer over the epitaxial layer.

The method further comprises forming an interlayer dielectric layer over the epitaxial layer, forming a plurality of trenches in the interlayer dielectric layer, forming a plurality of p+ regions at bottoms of respective trenches, performing a metal deposition process to fill the plurality of trenches to form a plurality of source contact plugs and a gate contact plug, and forming the source contact and the gate contact through an etching process.

Figure 31:
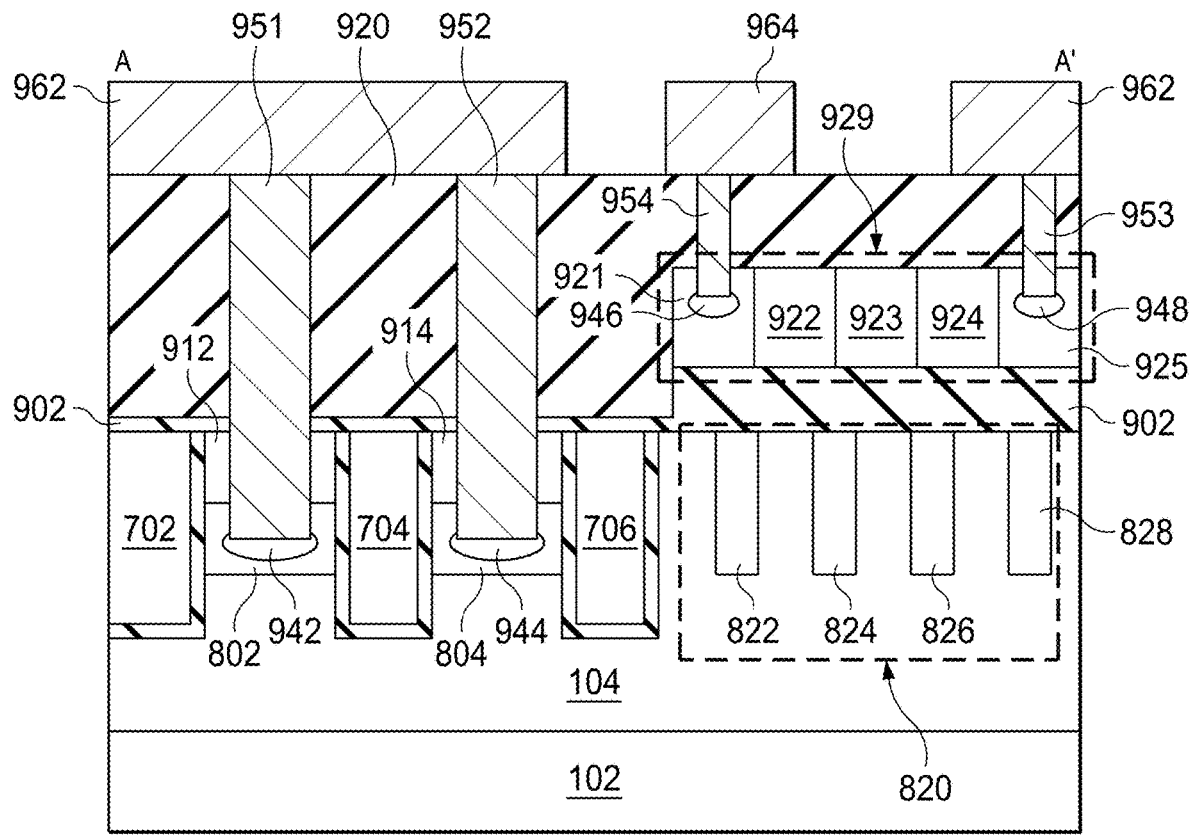
FIG. 31 a cross sectional view of the power MOSFET shown in FIG. 16 and a top view of the body ring structure in accordance with various embodiments of the present disclosure.
Figure 31:
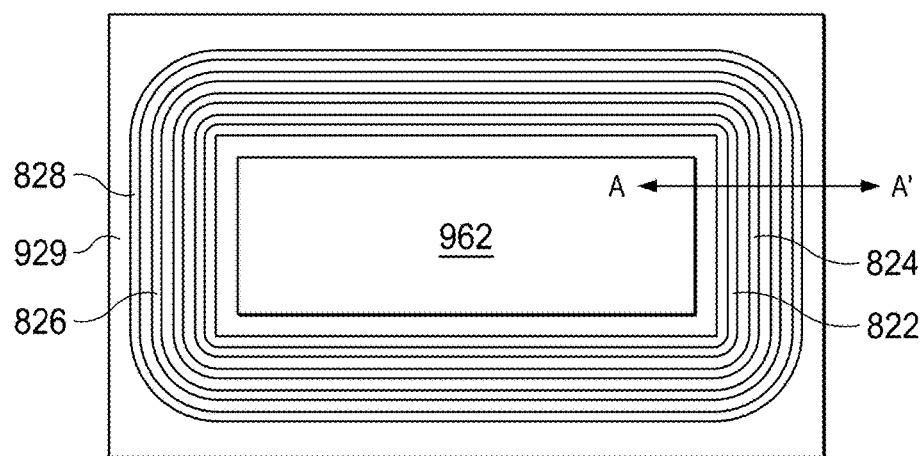

FIG. 31 a cross sectional view of the power MOSFET shown in FIG. 16 and a top view of the body ring structure in accordance with various embodiments of the present disclosure. The cross sectional view is taken along line A-A'. The cross sectional view of the power MOSFET has been described above with respect to FIGS. 1 and 16, and hence is not discussed again herein. As shown in the top view in FIG. 31, the source contact 962 is surrounded by an ESD polysilicon region (e.g., the gate-source ESD diode structure 929). The body ring structure 820 is a concentric ring structure. As shown in FIG. 31, the body ring structure 820 comprises a first rectangle having rounded corners, a second rectangle having rounded corners, a third rectangle having rounded corners and a fourth rectangle having rounded corners. In the cross sectional view, the first rectangle is represented by the column 822. The second rectangle is represented by the column 824. The third rectangle is represented by the column 826. The fourth rectangle is represented by the column 828.

As shown in FIG. 31, the body ring structure 820 comprises a plurality of rectangles having rounded corners. It is within the scope and spirit of the invention for the body ring structure 820 to comprise other shapes, such as, but not limited to oval, rectangle, square, or circular.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   growing an epitaxial layer over a substrate;
   forming a plurality of gates in the epitaxial layer, wherein the plurality of gates comprises a first gate trench, a second gate trench, and a third gate trench;
   forming a breakdown voltage enhancement and leakage prevention structure in the epitaxial layer, comprising a body ring structure, wherein the body ring structure is formed through an implantation process and is a concentric ring structure;
   forming a first source region and a second source region in the epitaxial layer, wherein the first source region is between the first gate trench and the second gate trench, and the second source region is between the second gate trench and the third gate trench;
   forming a gate-source Electrostatic Discharge (ESD) diode structure over the epitaxial layer;
   forming a source contact connected to the first source region, the second source region, and a first terminal of the gate-source ESD diode structure, and a gate contact connected to the plurality of gates and a second terminal of the gate-source ESD diode structure; and
   forming a drain contact on opposing sides of the epitaxial layer of the source contact.

2. The method of claim 1, wherein:
the body ring structure is configured to disperse an electric field on the gate-source ESD diode structure; and
the body ring structure and the gate-source ESD diode structure are separated by a dielectric layer.

3. The method of claim 2, wherein the step of forming the gate-source ESD diode structure over the epitaxial layer comprises:
forming a plurality of n-type regions and a plurality of p-type regions in an alternating manner in an interlayer dielectric layer over the epitaxial layer.

4. The method of claim 3, wherein:
the plurality of n-type regions and the plurality of p-type regions of the gate-source ESD diode structure comprise a first p-type region, a first n+ region, a second p-type region, a second n+ region, and a third p-type region, and wherein:
the first p-type region is connected to the gate contact; and
the third p-type region is connected to the source contact.

5. The method of claim 4, wherein the body ring structure comprises a plurality of rectangles, and wherein:
in a cross-sectional view, the plurality of rectangles of the body ring structure comprises a first column, a second column, a third column, and a fourth column, and wherein:
a sidewall of the first column is vertically aligned with a first sidewall of the first n+ region;
a sidewall of the second column is vertically aligned with a second sidewall of the first n+ region;
a sidewall of the third column is vertically aligned with a first sidewall of the second n+ region; and
a sidewall of the fourth column is vertically aligned with a second sidewall of the second n+ region.

6. The method of claim 1, further comprising:
forming an interlayer dielectric layer over the epitaxial layer;
forming a plurality of trenches in the interlayer dielectric layer;
forming a plurality of p+ regions at bottoms of respective trenches;
performing a metal deposition process to fill the plurality of trenches to form a plurality of source contact plugs and a gate contact plug; and
forming the source contact and the gate contact through an etching process.

7. The method of claim 1, further comprising:
forming a first body region between the first gate trench and the second gate trench, and forming a second body region between the second gate trench and the third gate trench;
forming a first source contact plug having a first terminal connected to the source contact, and a second terminal connected to the first source region and the first body region;
forming a second source contact plug having a first terminal connected to the source contact, and a second terminal connected to the second source region and the second body region;
forming a gate contact plug having a first terminal connected to the gate contact, and a second terminal connected to a first terminal of the gate-source ESD diode structure;
forming a third source contact plug having a first terminal connected to the source contact, and a second terminal connected to a second terminal of the gate-source ESD diode structure; and
forming an interlayer dielectric layer over the epitaxial layer, wherein the gate-source ESD diode structure is in the interlayer dielectric layer.

8. A method comprising:
growing an epitaxial layer over a substrate;
forming a plurality of gates in the epitaxial layer;
forming a source and a body region in the epitaxial layer;
forming a breakdown voltage enhancement and leakage prevention structure in the epitaxial layer, comprising a body ring structure;
forming a gate-source ESD diode structure over the epitaxial layer, wherein the gate-source ESD diode structure comprises a plurality of n-type regions and a plurality of p-type regions arranged in an alternating manner in an interlayer dielectric layer over the epitaxial layer;
forming a source contact connected to the source and a first terminal of the gate-source ESD diode structure;
forming a gate contact connected to the plurality of gates and a second terminal of the gate-source ESD diode structure; and
forming a drain contact on opposing sides of the epitaxial layer of the source contact.

9. The method of claim 8, wherein the step of forming the breakdown voltage enhancement and leakage prevention structure in the epitaxial layer comprises:
forming a body ring structure through an implantation process, wherein the body ring structure is a concentric ring structure.

10. The method of claim 9, wherein:
the body ring structure is configured to disperse an electric field on the gate-source ESD diode structure; and
the body ring structure and the gate-source ESD diode structure are separated by a dielectric layer.

11. The method of claim 10, wherein:
the plurality of n-type regions and the plurality of p-type regions of the gate-source ESD diode structure comprise a first p-type region, a first n+ region, a second p-type region, a second n+ region and a third p-type region connected in cascade, and wherein:
the first p-type region is connected to the gate contact; and
the third p-type region is connected to the source contact.

12. The method of claim 11, wherein the body ring structure comprises a plurality of rectangles, and wherein:
in a cross-sectional view, the plurality of rectangles of the body ring structure comprises a first column, a second column, a third column, and a fourth column, and wherein:
a sidewall of the first column is vertically aligned with a first sidewall of the first n+ region;
a sidewall of the second column is vertically aligned with a second sidewall of the first n+ region;
a sidewall of the third column is vertically aligned with a first sidewall of the second n+ region; and
a sidewall of the fourth column is vertically aligned with a second sidewall of the second n+ region.

13. The method of claim 9, further comprising:
forming a plurality of trenches in the interlayer dielectric layer;

forming a plurality of p+ regions at bottoms of respective trenches;

performing a metal deposition process to fill the plurality of trenches to form a plurality of source contact plugs and a gate contact plug; and forming the source contact and the gate contact through an etching process.

14. The method of claim 13, wherein:

at least one of the plurality of source contact plugs extends through the interlayer dielectric layer, the source and partially through the body region;

the gate contact plug extending partially through the interlayer dielectric layer;

the gate contact connected to the plurality of gates and a first terminal of the gate-source ESD diode structure through the gate contact plug; and the source contact connected to the source, the body region and a second terminal of the gate-source ESD diode structure through the plurality of source contact plugs.

15. The method of claim 9, wherein:

the source comprising a first source region and a second source region, and the step of forming the source in the epitaxial layer comprises:

forming the first source region between a first gate and a second gate of the plurality of gates; and forming the second source region between the second gate and a third gate of the plurality of gates.

16. The method of claim 9, wherein:

a bottommost surface of the body ring structure is aligned with a bottommost surface of the body region.

17. The method of claim 7, further comprising:

forming a p+ region at the second terminal of the gate contact plug; and forming a p+ region at the second terminal of each of the first, second, and third source contact plugs.

18. The method of claim 15, further comprising:

the body region comprising a first body region and a second body region, and the step of forming the body region in the epitaxial layer comprises:

forming the first body region between the first gate and the second gate of the plurality of gates; and forming the second body region between the second gate and the third gate of the plurality of gates.

19. The method of claim 18, further comprising:

forming a first source contact plug that extends through the interlayer dielectric layer, the first source region, and partially through the first body region;

forming a second source contact plug that extends through the interlayer dielectric layer, the second source region, and partially through the second body region;

forming a third source contact plug that extends partially through the interlayer dielectric layer; and forming a gate contact plug that extends partially through the interlayer dielectric layer.

20. The method of claim 19, further comprising:

forming a p+ region at a terminal of the gate contact plug; and forming a p+ region at a terminal of each of the first, second, and third source contact plugs.

\* \* \* \* \*